(12) United States Patent
Kanatani et al.

(10) Patent No.: US 7,282,323 B2
(45) Date of Patent: Oct. 16, 2007

(54) HIGHLY HEAT-RESISTANT, NEGATIVE-TYPE PHOTOSENSITIVE RESIN COMPOSITION

(75) Inventors: Ryuichiro Kanatani, Fuji (JP); Masashi Kimura, Fuji (JP); Kimiyuki Maruyama, Fuji (JP)

(73) Assignee: Asahi Kasei EMD Corporation, Tokyo (JP)

( * ) Notice: Subject to any disclaimer, the term of this patent is extended or adjusted under 35 U.S.C. 154(b) by 0 days.

(21) Appl. No.: 10/520,417

(22) PCT Filed: Jul. 10, 2003

(86) PCT No.: PCT/JP03/08792

§ 371 (c)(1), (2), (4) Date: Jan. 6, 2005

(87) PCT Pub. No.: WO2004/008252

PCT Pub. Date: Jan. 22, 2004

(65) Prior Publication Data
US 2005/0244739 A1    Nov. 3, 2005

(30) Foreign Application Priority Data
Jul. 11, 2002    (JP) .............................. 2002-202732

(51) Int. Cl.
*G03F 7/037* (2006.01)
*G03F 7/40* (2006.01)

(52) U.S. Cl. .................. 430/281.1; 430/18; 430/287.1; 430/288.1; 430/325; 430/330

(58) Field of Classification Search ............ 430/287.1, 430/281.1, 288.1, 270.1, 325, 330, 18
See application file for complete search history.

(56) References Cited

U.S. PATENT DOCUMENTS

| | | | | |
|---|---|---|---|---|
| 5,025,088 | A | * | 6/1991 | Maeda et al. ................ 528/353 |
| 5,446,074 | A | * | 8/1995 | Czornyj et al. ............. 522/164 |
| 5,472,823 | A | * | 12/1995 | Hagiwara et al. ........ 430/270.1 |
| 6,929,891 | B2 | * | 8/2005 | Rushkin et al. ................ 430/18 |

FOREIGN PATENT DOCUMENTS

| | | |
|---|---|---|
| JP | 63-96162 | 4/1988 |
| JP | 1-46862 | 10/1989 |
| JP | 7-242744 | 9/1995 |
| JP | 2000-221677 | 8/2000 |
| JP | 2001-42527 | 2/2001 |
| JP | 2002-12665 | 1/2002 |
| JP | 2002-72470 | 3/2002 |

* cited by examiner

*Primary Examiner*—John S. Chu
(74) *Attorney, Agent, or Firm*—Finnegan, Henderson, Farabow, Garrett & Dunner, L.L.P.

(57) ABSTRACT

Disclosed is a negative type photosensitive resin composition comprising (A) a polyamide having a photopolymerizable unsaturated double bond, (B) a monomer having a photopolymerizable unsaturated double bond, (C) a photopolymerization initiator and (D) a melamine resin.

11 Claims, No Drawings

HIGHLY HEAT-RESISTANT, NEGATIVE-TYPE PHOTOSENSITIVE RESIN COMPOSITION

BACKGROUND ART

The present invention relates to a negative type photosensitive resin composition used for the formation of heat resistant relief patterns of passivation films, buffer coat films and layer insulation films in insulation materials of electronic parts and semiconductor devices.

BACKGROUND ART

Hitherto, polyimide resins having all of excellent heat resistance, electric characteristics and mechanical characteristics have been used for passivation films, surface protective films and layer insulation films in insulation materials of electronic parts and semiconductor devices. Of these polyimide resins, in the case of those which are used in the form of negative type photosensitive polyimide precursor compositions, heat resistant relief pattern films can be easily formed by coating them and subjecting the coating to exposure, development and hot imidation. Such negative type photosensitive polyimide precursor compositions have the advantage that the steps involved can be considerably shortened as compared with when conventional non-sensitive polyimides are used.

However, when the above negative type photosensitive polyimide precursor compositions are used, it is necessary to use organic solvents such as pyrrolidones and ketones in a large amount as developers in the developing step, and it is required not to use organic solvents from the points of view of safety and recent growing interest in environmental protection. Under the circumstances, various proposals for heat resistant photosensitive resin materials which can be developed with a dilute aqueous alkali solution, as well as photo resists, have recently been made in the above-mentioned fields of materials.

Among them, the utilization of a hydroxypolyamide soluble in an aqueous alkali solution, for example, polybenzoxazole precursors, has recently been made. As these methods, there are known a method of using a positive type photosensitive material formed by mixing a polybenzoxazole precursor and a photoactive component such as quinonediazide (JP-B-1-46862, JP-A-63-96162, etc.), a method of using a negative type photosensitive material prepared by introducing a photopolymerizable unsaturated double bond-containing group into a part of phenolic hydroxyl groups of a polybenzoxazole precursor, followed by mixing with a monomer having a photopolymerizable unsaturated double bond, a photopolymerization initiator and the like (JP-A-2002-12665), and others.

In the case of a negative type photosensitive material, a resin having a photopolymerizable unsaturated double bond or the like is polymerized by irradiation with light and as a result, becomes insoluble in the developer. On the other hand, in the case of a positive type photosensitive material, a resin which is lower in solubility in the developer due to the interaction with a mixed photoactive component becomes soluble in the developer due to the decomposition of the photoactive component caused by irradiation with light. Therefore, when a resin is used as a negative type photosensitive material, in which the difference in solubility in the developer between the light irradiated part and the light non-irradiated part can be made greater, process margins can be made much broader than when it is used as a positive photosensitive material, and hence the relief pattern can be easily formed after development. Moreover, in general, the negative photosensitive materials are higher than the positive photosensitive materials in the storage stability of the composition.

Furthermore, since a polybenzoxazole film has similar thermosetting characteristics to those of a polyimide film, a negative type photosensitive polybenzoxazole precursor which can be developed with a dilute aqueous alkali solution is expected to be a promising substitute material for a organic solvent developing type negative type photosensitive polyimide precursor.

On the other hand, there are various changes in the method of packaging a semiconductor device in which the above materials are used. Recently, from the viewpoints of improvement of integration and function, and miniaturization of chip size, there is a marked tendency to use a multilayer interconnection package, and the conditions to which the polyimide film or polybenzoxazole film is exposed during the process of formation of the structures are further diversified. Therefore, the semiconductor materials are required to have higher chemical resistance to strong acids and strong bases.

Moreover, for the same reasons, the method for mounting semiconductor devices on print wiring substrates is changing from the conventional mounting method using a metal pin and a lead-tin eutectic solder to the methods in which a polyimide film or polybenzoxazole film of the semiconductor devices directly contacts with solder bumps, such as BGA (ball grid array) and CSP (chip size packaging) according to which a higher density mounting can be attained. The solders used are also being changed to those of high melting point free from lead for the purpose of reduction of environmental load, and furthermore the solders for bumps are generally those which are further higher in melting point than those for mounting on substrates.

That is, the polyimide films or polybenzoxazole films of semiconductor devices are exposed to unexpectedly high temperatures while contacting with flux at the reflow step of solder bumps, and hence they are required to have higher heat resistance and high-temperature flux resistance.

An object of the present invention is to provide a method for forming on a substrate a relief pattern having conspicuously high heat resistance and chemical resistance after curing with heating and a negative type photosensitive resin composition of high efficiency used for the above method. Another object is to provide a method for producing semiconductor devices using the above method or the above negative type photosensitive resin composition.

DISCLOSURE OF INVENTION

As a result of intensive research conducted by the inventors for attaining the above objects, it has been found that in the case of heating a polyamide film having a relief pattern formed by development to 200° C. or higher to thereby convert the polyamide film to a polyimide or polybenzoxazole skeleton structure, when a compound which can perform intermolecular crosslinking of the polyamide film or which per se can form a crosslinked network (the compound being hereinafter referred to as "crosslinking agent") is added simultaneously, a film having a crosslinked polyimide or crosslinked polybenzoxazole skeleton structure which is further improved in heat resistance and chemical resistance can be obtained. As a result of the investigation of various crosslinking agents, it has been found that the above objects can be attained at a high level by adding a melamine resin to a specific negative type photosensitive resin composition used in the present invention. Thus, the present invention has been accomplished.

That is, the present application provides the following inventions.

(I) A negative type photosensitive resin composition which comprises:

(A) a polyamide having a structural unit represented by the following formula (1) and having a photopolymerizable unsaturated double bond: 100 parts by mass, (B) a monomer having a photopolymerizable unsaturated double bond: 1-50 parts by mass, (C) a photopolymerization initiator: 1-20 parts by mass, and (D) a melamine resin: 5-30 parts by mass,

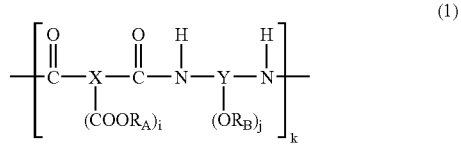

(where X is a 2-4 valent aromatic group and Y is a 2-4 valent aromatic group, i and j are integers of 0-2 and satisfy i+j=2, k is an integer of 2-150, $R_A$ is independently a monovalent organic group having a photopolymerizable unsaturated double bond and represented by the following formula (2) or a saturated aliphatic group of 1-4 carbon atoms, and $R_B$ is independently a hydrogen atom or a monovalent organic group having a photopolymerizable unsaturated double bond and represented by the following formula (3), with the proviso that when the total mol number of $R_B$ is assumed to be 100 mol %, not less than 10 mol % and not more than 50 mol % thereof is the monovalent organic group having a photopolymerizable unsaturated double bond and represented by the following formula (3).

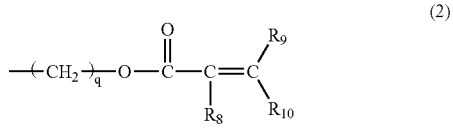

where $R_8$ is a hydrogen atom or an organic group of 1-3 carbon atoms, $R_9$ and $R_{10}$ are independently a hydrogen atom or an organic group of 1-3 carbon atoms, and q is an integer of 2-10,

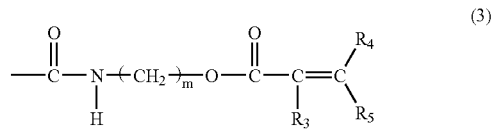

where $R_3$ is a hydrogen atom or an organic group of 1-3 carbon atoms, $R_4$ and $R_5$ are independently a hydrogen atom or an organic group of 1-3 carbon atoms, and m is an integer of 2-10).

(II) A negative type photosensitive resin composition described in the above (I), wherein the polyamide (A) having a photopolymerizable unsaturated double bond is a polybenzoxazole precursor having a structural unit represented by the following formula (4):

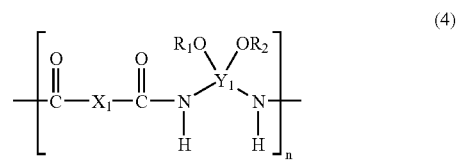

(where $X_1$ is a divalent aromatic group, $Y_1$ is a tetravalent aromatic group, n is an integer of 2-150, and $R_1$ and $R_2$ are independently a hydrogen atom or a monovalent organic group having a photopolymerizable unsaturated double bond and represented by the following formula (3), with the proviso that when the total mol of $R_1$ and $R_2$ is assumed to be 100 mol %, not less than 10 mol % and not more than 50 mol % of $R_1$ and $R_2$ are the monovalent organic groups having a photopolymerizable unsaturated double bond and represented by the following formula (3):

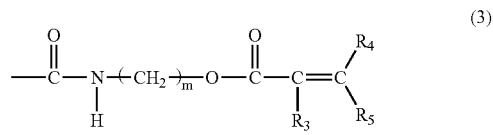

where $R_3$ is a hydrogen atom or an organic group of 1-3 carbon atoms, $R_4$ and $R_5$ are independently a hydrogen atom or an organic group of 1-3 carbon atoms, and m is an integer of 2-10).

(III) A negative type photosensitive resin composition described in the above (I), wherein the polyamide (A) having a photopolymerizable unsaturated double bond is a polyimide precursor having a structural unit represented by the following formula (5):

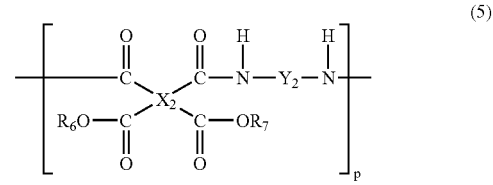

(where $X_2$ is a tetravalent aromatic group, and the —COOR$_6$ group and the —COOR$_7$ group, and the —CONH— group adjacent thereto are in the ortho position to each other, $Y_2$ is a divalent aromatic group, p is an integer of 2-150, and $R_6$ and $R_7$ are independently a monovalent organic group having a photopolymerizable unsaturated double bond and represented by the following formula (2) or an aliphatic group of 1-4 carbon atoms:

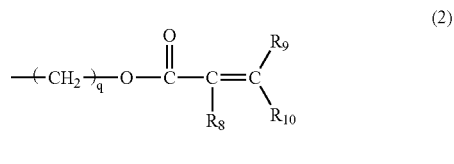

(2)

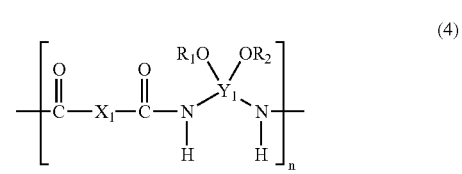

(4)

where $R_8$ is a hydrogen atom or an organic group of 1-3 carbon atoms, $R_9$ and $R_{10}$ are independently a hydrogen atom or an organic group of 1-3 carbon atoms, and q is an integer of 2-10).

(IV) A negative type photosensitive resin composition described in any one of the above (I)-(III), wherein the melamine resin (D) has a polymerization degree of not less than 1.0 and not more than 2.2.

(V) A negative type photosensitive resin composition described in any one of the above (I)-(III), wherein the melamine resin (D) is a hexamethoxymethylated melamine.

(VI) A method for forming a heat resistant and chemical resistant relief pattern which comprises: (1) coating the negative type photosensitive resin composition described in any one of the above (I)-(V) on a substrate, (2) subjecting the coating to exposure by irradiating with active rays through a patterning mask, (3) dissolving and removing the unexposed portions of the coating using a developer to form a relief pattern, and (4) heating the coating at a temperature of not lower than 200° C. to cure the coating.

(VII) A method for producing a semiconductor device which includes forming a relief pattern by the relief pattern forming method described in the above (VI).

(VIII) A method for producing a semiconductor device which includes using the negative type photosensitive resin composition described in any one of the above (I)-(V).

Best Mode For Carrying out the Invention

The present invention will be explained in detail below.

The negative type photosensitive resin composition of the present invention contains the following four components as essential components.

Component A: A polyamide having a photopolymerizable unsaturated double bond.

Component B: A monomer having a photopolymerizable unsaturated double bond.

Component C: A photopolymerization initiator.

Component D: A melamine resin.

<Component A>

First, the component A represented by the above formula (1) will be explained.

A preferred component A in the negative type photosensitive resin composition of the present invention is a polyamide having a photopolymerizable unsaturated double bond, which can be converted to polybenzoxazole or polyimide by subjecting to a heat cyclization treatment at 200° C. or higher.

As the component (A) in the present invention, a polybenzoxazole precursor having a structural unit represented by the following formula (4) is particularly useful.

(where $X_1$ is a divalent aromatic group, $Y_1$ is a tetravalent aromatic group, n is an integer of 2-150, and $R_1$ and $R_2$ are independently a hydrogen atom or a monovalent organic group represented by the following formula (3) having a photopolymerizable unsaturated double bond, with the proviso that when the total mol of $R_1$ and $R_2$ is assumed to be 100 mol %, not less than 10 mol % and not more than 50 mol % of $R_1$ and $R_2$ are the monovalent organic groups represented by the following formula (3) having a photopolymerizable unsaturated double bond:

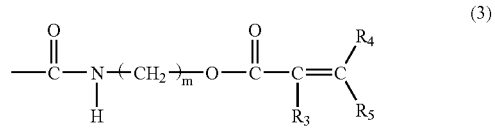

(3)

where $R_3$ is a hydrogen atom or an organic group of 1-3 carbon atoms, $R_4$ and $R_5$ are independently a hydrogen atom or an organic group of 1-3 carbon atoms, and m is an integer of 2-10).

As the divalent aromatic group represented by $X_1$ in the formula (4), mention may be made of the following structures.

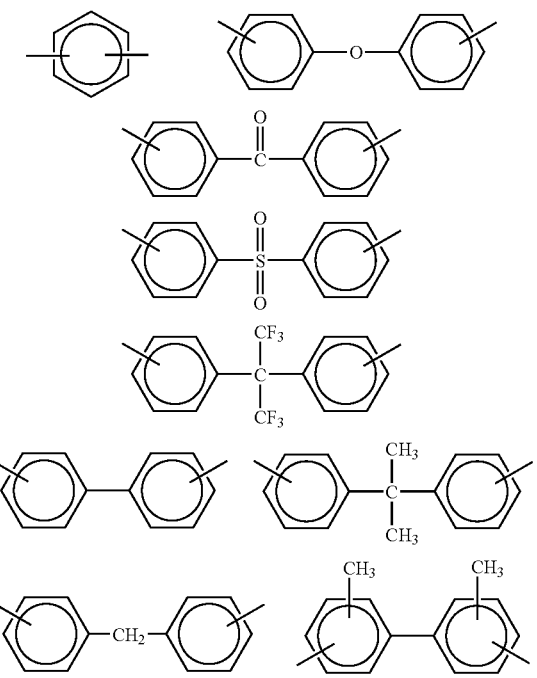

-continued

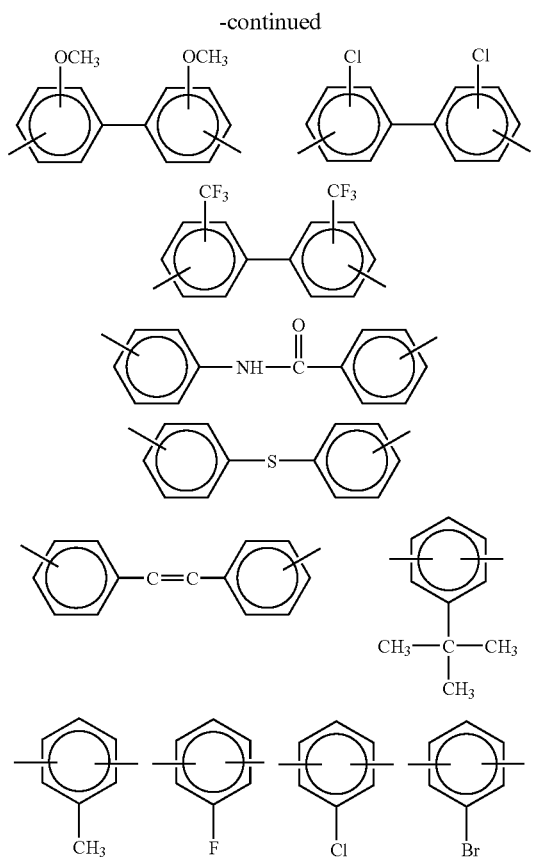

Similarly, as the tetravalent aromatic group represented by Y₁ in the formula (4), mention may be made of the following structures.

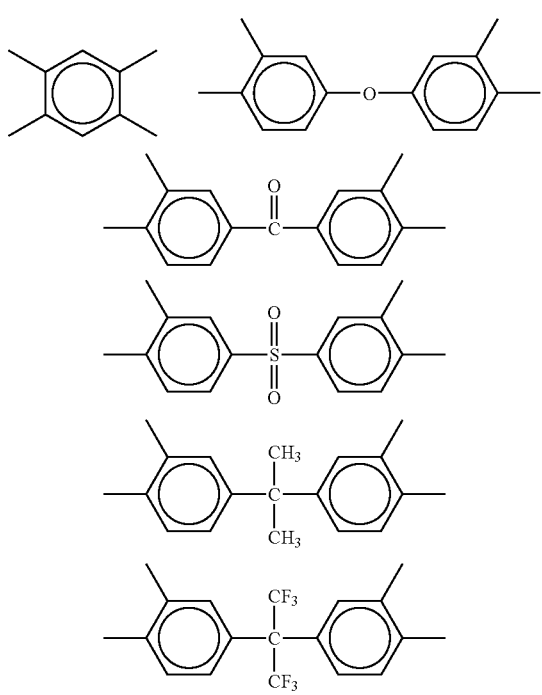

In the present invention, the polybenzoxazole precursor represented by the formula (4) can be obtained by first preparing an amide polycondensate (a base polymer) of an aromatic dicarboxylic acid having a divalent aromatic group $X_1$ or a derivative thereof and a bis(o-aminophenol) having a tetravalent aromatic group $Y_1$ and then introducing a group having a photopolymerizable unsaturated double bond into a part of the hydroxyl groups of the polycondensate.

(Preparation of Base Polymer)

The dicarboxylic acids having a divalent aromatic group $X_1$ or derivatives thereof suitable for use in the present invention include, for example, phthalic acid, isophthalic acid, terephthalic acid, 4,4'-diphenyl ether dicarboxylic acid, 3,4'-diphenyl ether dicarboxylic acid, 3,3'-diphenyl ether dicarboxylic acid, 4,4'-biphenyldicarboxylic acid, 3,4'-biphenyldicarboxylic acid, 3,3'-biphenyldicarboxylic acid, 4,4'-benzophenonedicarboxlic acid, 3,4'-benzophenonedicarboxylic acid, 3,3'-benzophenonedicarboxylic acid, 4,4'-hexafluoroisopropylidenedibenzoic acid, 4,4'-dicarboxydiphenylamide, 1,4-phenylenediethanoic acid, 1,1-bis(4-carboxyphenyl)-1-phenyl-2,2,2-trifluoroethane, bis(4-carboxyphenyl) sulfide, bis(4-carboxyphenyl) tetraphenyldisiloxane, bis(4-carboxyphenyl) tetramethyldisiloxane, bis(4-carboxyphenyl) sulfone, bis(4-carboxyphenyl)methane, 5-tert-butylisophthalic acid, 5-bromoisophthalic acid, 5-fluoroisophthalic acid, 5-chloroisophthalic acid, 2,2-bis-(p-carboxyphenyl)propane, 4,4'-(p-phenylenedioxy)dibenzoic acid, 2,6-naphthalenedicarboxylic acid, and acid chlorides of them, and active esters of them with hydroxybenzotriazole and the like. These may be used each alone or in admixture.

Furthermore, the bis(o-aminophenol) having a tetravalent aromatic group Y, suitable for use in the present invention includes, for example, 3,3-dihydroxybenzidine, 3,3'-diamino-4,4'-dihydroxybiphenyl, 3,3'-dihydroxy-4,4'-diaminodiphenyl sulfone, bis-(3-amino-4-hydroxyphenyl)methane, 2,2-bis-(3-amino-4-hydroxyphenyl)propane, 2,2-bis-(3-amino-4-hydroxyphenyl)hexafluoropropane, 2,2-bis-(3-hydroxy-4-aminophenyl)hexafluoropropane, bis-(3-hydroxy-4-aminophenyl)methane, 2,2-bis-(3-hydroxy-4-aminophenyl)propane, 3,3'-dihydroxy-4,4'-diaminobenzophenone, 3,3'-dihydroxy-4,4'-diaminodiphenyl ether, 4,4'-dihydroxy-3,3'-diaminodiphenyl ether, 3,3'-dihydroxy-4,4'-diaminobiphenyl, 3,3'-diamino-4,4'-dihydroxybiphenyl, 2,15-dihydroxy-1,4-diaminobenzene, 4,6-diaminoresorcinol, and mixtures thereof.

Furthermore, for the purpose of improving adhesion to a substrate, a diaminosiloxane such as 1,3-bis(3-aminopropyl)tetramethyldisiloxane or 1,3-bis(3-aminopropyl)tetraphenyldisiloxane can be copolymerized together with the bis (o-aminophenol).

In the case of using an aromatic dicarboxylic acid dichloride or an active ester of the aromatic dicarboxylic acid, a base polymer can be obtained by mixing it with the bis-(o-aminophenol) in a suitable solvent in the presence of a basic compound such as pyridine.

On the other hand, in the case of using an aromatic dicarboxylic acid, a suitable condensation agent is necessary. As the condensation agent, there may be used known dehydration condensation agents. The condensation agents include, for example, dicyclohexylcarbodiimide, 1-ethoxycarbonyl-2-ethoxy-1,2-dihydroquinoline, 1,1'-carbonyldioxy-di-1,2,3-benzotriazole, N,N'-disuccinimidyl carbonate and phosphorous esters. Among them, when dicyclohexylcarbodiimide is used, it is preferred to use it together with 1-hydroxy-1,2,3-benzotriazole.

The reaction solvents are preferably those which completely dissolve the resulting base polymer. Examples of the solvents are N-methyl-2-pyrrolidone, N,N-dimethylacetamide, N,N-dimethylformamide, dimethyl sulfoxide, tetramethylurea and γ-butyrolactone.

Examples of other reaction solvents are ketones, esters, lactones, ethers, halogenated hydrocarbons and hydrocarbons, and they include, for example, acetone, methyl ethyl ketone, methyl isobutyl ketone, cyclohexanone, methyl acetate, ethyl acetate, butyl acetate, diethyl oxalate, ethylene glycol dimethyl ether, diethylene glycol dimethyl ether, tetrahydrofuran, dichloromethane, 1,2-dichloroethane, 1,4-dichlorobutane, chlorobenzene, o-dichlorobenzene, hexane, heptane, benzene, toluene, and xylene. These may be used each alone or in admixture.

When an aromatic dicarboxylic acid dichloride is used as the starting material, it is preferably dissolved in a non-polar solvent such as a glycol ether type among the above solvents and then used for the reaction in order to inhibit decomposition deactivation of the starting material.

After completion of the reaction, the reaction mixture is introduced into a poor solvent for the base polymer, such as water or a mixture of water and an aliphatic lower alcohol, and the base polymer is dispersed and precipitated, followed by, for example, repeating reprecipitation to perform purification, and carrying out vacuum drying to isolate the base polymer.

In order to further improve the degree of purification, the base polymer solution may be passed through a column packed with a both an anion and a cation exchange resin swelled with a suitable organic solvent to remove ionic impurities.

(Introduction of a Group Having a Photopolymerizable Unsaturated Double Bond)

In the component A of the present invention, the polyamide represented by the formula (4) having a photopolymerizable unsaturated double bond is obtained by re-dissolving the base polymer obtained by the above reaction in an organic solvent or the like and reacting the solution with an isocyanate compound represented by the following formula (6) having a photopolymerizable unsaturated double bond.

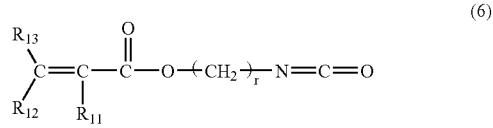

(6)

(where $R_{11}$ is a hydrogen atom or an organic group of 1-3 carbon atoms, $R_{12}$ and $R_{13}$ are independently a hydrogen atom or an organic group of 1-3 carbon atoms, and r is an integer of 2-10).

As examples of the isocyanate compound having a photopolymerizable unsaturated double bond and represented by the formula (6), mention may be made of isocyanatoethyl acrylate, isocyanatopropyl acrylate, isocyanatobutyl acrylate, isocyanatopentyl acrylate, isocyanatohexyl acrylate, isocyanatooctyl acrylate, isocyanatodecyl acrylate, isocyanatooctadecyl acrylate, isocyanatoethyl methacrylate, isocyanatopropyl methacrylate, isocyanatobutyl methacrylate, isocyanatopentyl methacrylate, isocyanatohexyl methacrylate, isocyanatooctyl methacrylate, isocyanatodecyl methacrylate, isocyanatooctadecyl methacrylate, isocyanatoethyl crotonate, isocyanatopropyl crotonate, isocyanatobutyl crotonate, isocyanatopentyl crotonate, isocyanatohexyl crotonate, and the like, and preferred is 2-isocyanatoethyl methacrylate.

The reaction of the base polymer with the isocyanate compound is usually carried out under temperature conditions of 0-100° C., preferably 20-70° C., and the reaction proceeds more easily when amines such as triethylamine, pyridine, dimethylaminopyridine, quinuclidine and 1,4-diazabicyclo[2,2,2]octane or tin compounds such as dibutyltin dilaurate and dibutyltin diacetate are used as catalysts.

The organic solvents used for the reaction are preferably those which are inert to an isocyanate group and completely dissolve the dissolved components including the base polymer and reaction products, and they include, for example, N-methyl-2-pyrrolidone, N,N-dimethylacetamide, N,N-dimethylformamide, dimethyl sulfoxide and γ-butyrolactone. Other examples of the organic solvents are ketones, esters, lactones, ethers, halogenated hydrocarbons and hydrocarbons, and they include, for example, acetone, methyl ethyl ketone, methyl isobutyl ketone, cyclohexanone, methyl acetate, ethyl acetate, butyl acetate, diethyl oxalate, ethylene glycol dimethyl ether, diethylene glycol dimethyl ether, tetrahydrofuran, dichloromethane, 1,2-dichloroethane, 1,4-dichlorobutane, chlorobenzene, o-dichlorobenzene, hexane, heptane, benzene, toluene, and xylene. These may be used each alone or in admixture.

The reaction product can be used, as it is, as the component A of the negative type photosensitive resin composition of the present invention, but if necessary the reaction product may be introduced into a poor solvent for the resulting polymer component, such as water or a mixture of water and an aliphatic lower alcohol to disperse and precipitate the reaction product, followed by further repeating reprecipitation to perform purification, and carrying out drying, and thus the product may be used as the component A.

The introduction proportion of the isocyanate compound having a photopolymerizable unsaturated double bond into the base polymer is preferably not less than 10 mol % and not more than 50 mol % based on the mol number of the hydroxyl groups in the base polymer. That is, it is preferred that when the total mol number of $R_1$ and $R_2$ in the formula (4) is assumed to be 100 mol %, not less than 10 mol % and not more than 50 mol % of $R_1$ and $R_2$ are the organic groups having a photopolymerizable unsaturated double bond.

If the introduction proportion of the isocyanate compound is less than 10 mol % based on the mol number of the hydroxyl groups in the base polymer, crosslinking density in photopolymerization is too low, and hence photosensitivity is low and swelling of relief patterns is apt to occur. Thus, practically acceptable relief patterns can hardly be obtained. Similarly, if the introduction proportion exceeds 50 mol %, since the concentration of the phenolic hydroxyl groups in the skeleton excessively decreases, solubility of the resulting polyamide polymer in an aqueous alkali solution developer conspicuously lowers and unexposed portions which are not dissolved are apt to remain after the development. Thus, the resulting polyamide is practically unacceptable.

Since the isocyanate compound is high in activity, a reaction of partial dimerization of the isocyanate compound per se unavoidably takes place through the dissolved water in the reaction solution. Therefore, the amount of the isocyanate compound charged in actual reaction must be somewhat larger than the desired introduction proportion, and it is preferably 10-80 mol % based on the mol number of the hydroxyl groups in the base polymer.

Moreover, as the component (A) of the present invention, a polyimide precursor having a structural unit represented by the following formula (5) is also useful.

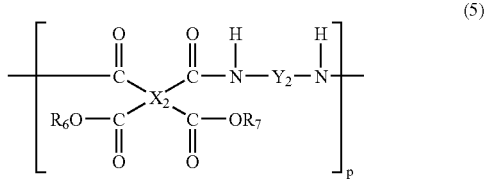

(5)

(where $X_2$ is a tetravalent aromatic group, and the —$COOR_6$ group and the —$COOR_7$ group, and the —CONH— group adjacent thereto are in the ortho position to each other, $Y_2$ is a divalent aromatic group, p is an integer of 2-150, and $R_6$ and $R_7$ are independently a monovalent organic group represented by the following formula (2) having a photopolymerizable unsaturated double bond or a saturated aliphatic group of 1-4 carbon atoms:

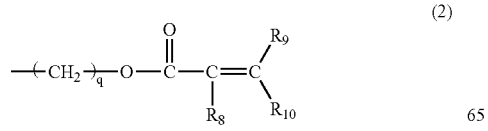

(2)

where $R_8$ is a hydrogen atom or an organic group of 1-3 carbon atoms, $R_9$ and $R_{10}$ are independently a hydrogen atom or an organic group of 1-3 carbon atoms, and q is an integer of 2-10).

As examples of the tetravalent aromatic group represented by $X_2$ in the above formula (5), mention may be made of the following structures.

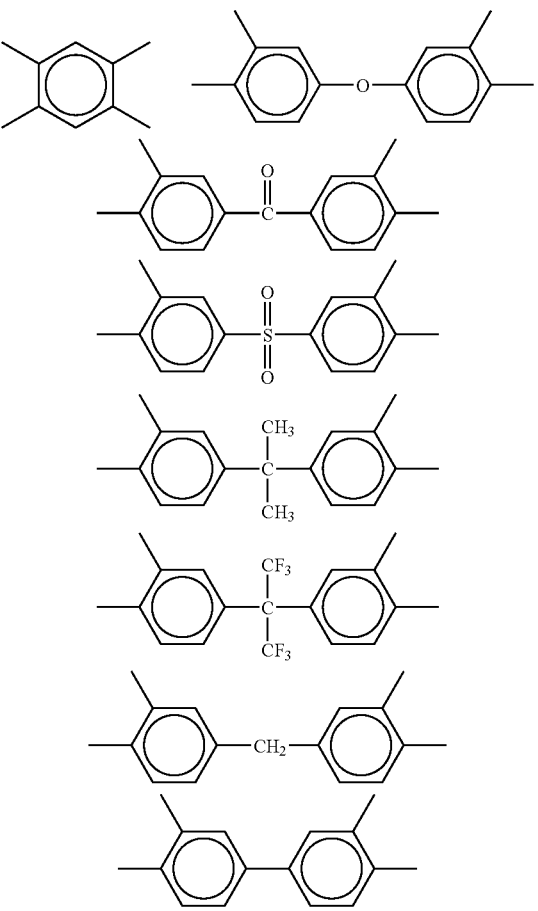

As examples of the divalent aromatic group represented by $Y_2$ in the above formula (5), mention may be made of the following structures.

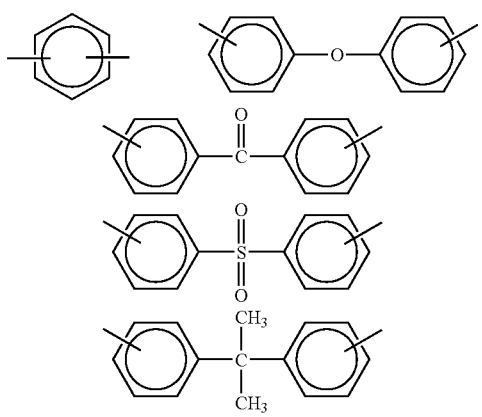

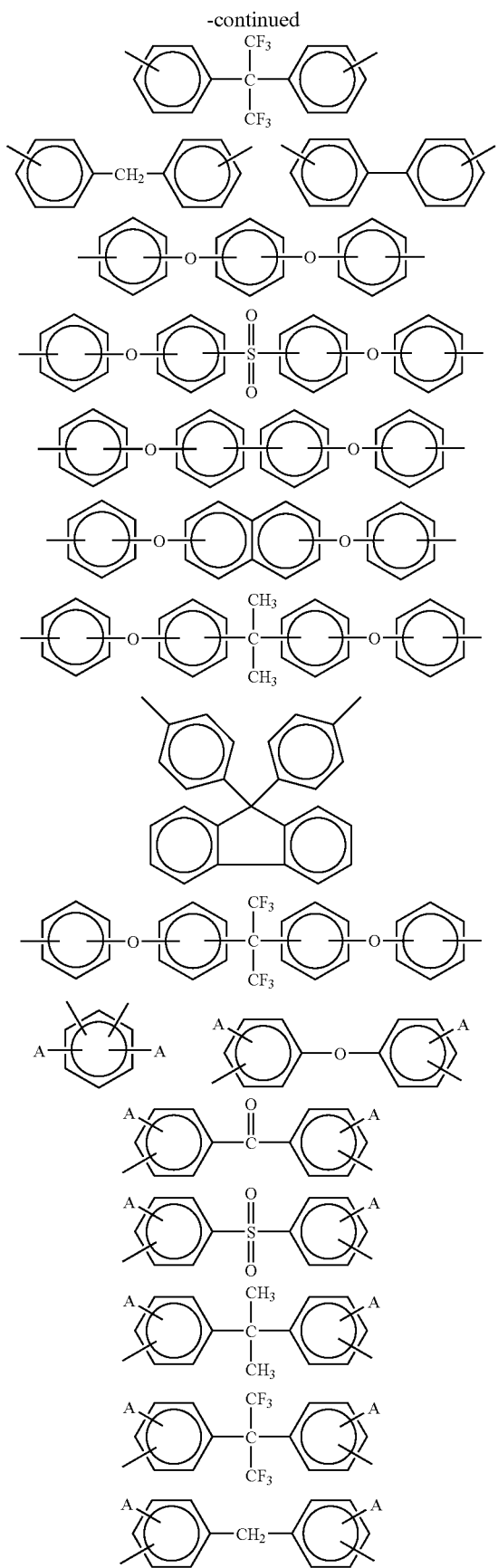

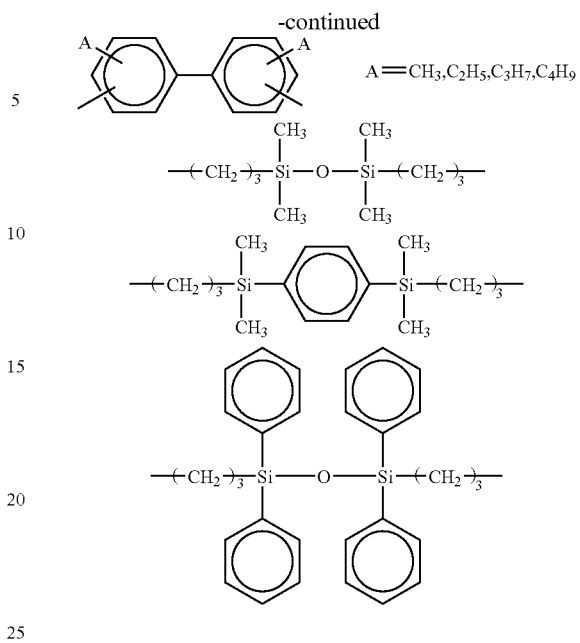

The polyimide precursor represented by the formula (5) in the present invention is obtained by first reacting an aromatic tetracarboxylic acid dianhydride having a tetravalent aromatic group $X_2$ with an alcohol having a photopolymerizable unsaturated double bond and/or a saturated aliphatic alcohol of 1-4 carbon atoms to prepare a half acid/half ester and then carrying out amide polycondensation between the half acid/half ester and an aromatic diamine having a divalent aromatic group $Y_2$.

(Preparation of the Half Acid/Half Ester)

As the tetracarboxylic acid dianhydride having a tetravalent aromatic group $X_2$ suitable for use in the present invention, mention may be made of, for example, pyromellitic anhydride, diphenyl ether-3,3',4,4'-tetracarboxylic acid dianhydride, benzophenone-3,3',4,4'-tetracarboxylic acid dianhydride, biphenyl-3,3',4,4'-tetracarboxylic acid dianhydride, diphenylsulfone-3,3',4,4'-tetracarboxylic acid dianhydride, diphenylmethane-3,3',4,4'-tetracarboxylic acid dianhydride, 2,2-bis(3,4-phthalic anhydride)propane, and 2,2-bis(3,4-phthalic anhydride)-1,1,1,3,3,3-hexafluoropropane. These may be used not only each alone, but also in a combination of two or more.

As the alcohols having a photopolymerizable unsaturated double bond suitable for use in the present invention, mention may be made of, for example, 2-acryloyloxyethyl alcohol, 1-acryloyloxy-3-propyl alcohol, 2-acrylamidethyl alcohol, methylolvinyl ketone, 2-hydroxyethylvinyl ketone, 2-hydroxy-3-methoxypropyl acrylate, 2-hydroxy-3-butoxypropyl acrylate, 2-hydroxy-3-phenoxypropyl acrylate, 2-hydroxy-3-butoxypropyl acrylate, 2-hydroxy-3-t-butoxypropyl acrylate, 2-hydroxy-3-cyclohexyloxypropyl acrylate, 2-methacryloyloxyethyl alcohol, 1-methacryloyloxy-3-propyl alcohol, 2-methacrylamidethyl alcohol, 2-hydroxy-3-methoxypropyl methacrylate, 2-hydroxy-3-butoxypropyl methacrylate, 2-hydroxy-3-phenoxypropyl methacrylate, 2-hydroxy-3-butoxypropyl methacrylate, 2-hydroxy-3-t-butoxypropyl methacrylate, and 2-hydroxy-3-cyclohexyloxypropyl methacrylate.

The above alcohols may be partially mixed with a saturated aliphatic alcohol of 1-4 carbon atoms, for example, methanol, ethanol, n-propanol, isopropanol, n-butanol or tert-butanol, and thus they may be used as a mixture.

In the polyimide precursor represented by the above formula (5), when the total mol of $R_6$ and $R_7$ is assumed to be 100 mol %, preferably not less than 70 mole%, more preferably not less than 90 mol %, and most preferably not less than 95 mol % of $R_6$ and $R_7$ are organic groups having an unsaturated double bond derived from the above alcohols.

When the above aromatic acid dianhydride and alcohol suitable for the present invention are dissolved and mixed with stirring in a suitable solvent in the presence of a basic catalyst such as pyridine, esterification reaction of the acid anhydride proceeds and the desired half acid/half ester can be obtained.

The reaction solvents are preferably those which completely dissolve the half acid/half ester and the polyimide precursor which is an amide polycondensation product of the half acid/half ester with a diamine component. Examples of the reaction solvents are N-methyl-2-pyrrolidone, N,N-dimethylacetamide, N,N-dimethylformamide, dimethyl sulfoxide, tetramethylurea and γ-butyrolactone.

Examples of other reaction solvents are ketones, esters, lactones, ethers, halogenated hydrocarbons and hydrocarbons, and they include, for example, acetone, methyl ethyl ketone, methyl isobutyl ketone, cyclohexanone, methyl acetate, ethyl acetate, butyl acetate, diethyl oxalate, ethylene glycol dimethyl ether, diethylene glycol dimethyl ether, tetrahydrofuran, dichloromethane, 1,2-dichloroethane, 1,4-dichlorobutane, chlorobenzene, o-dichlorobenzene, hexane, heptane, benzene, toluene, and xylene. These may be used each alone or in admixture.

(Preparation of Polyimide Precursor)

To the above half acid/half ester solution is added under cooling with ice a suitable dehydration condensation agent such as dicyclohexylcarbodiimide, 1-ethoxycarbonyl-2-ethoxy-1,2-dihydroquinoline, 1,1'-carbonyldioxy-di-1,2,3-benzotriazole or N,N'-disuccineimidyl carbonate, followed by mixing them to convert the half acid/half ester to a polyacid anhydride. Thereto is added dropwise a solution or dispersion of a diamine having a divalent aromatic group $Y_2$ suitable for use in the present invention which is separately prepared by dissolving or dispersing in a solvent, thereby to carry out amide polycondensation resulting in the desired polyimide precursor.

As the diamines having the divalent aromatic group $Y_2$ suitable for use in the present invention, mention may be made of, for example, p-phenylenediamine, m-phenylenediamine, 4,4'-diaminodiphenyl ether, 3,4'-diaminodiphenyl ether, 3,3'-diaminodiphenyl ether, 4,4'-diaminodiphenyl sulfide, 3,4'-diaminodiphenyl sulfide, 3,3'-diaminodiphenyl sulfide, 4,4'-diaminodiphenyl sulfone, 3,4'-diaminodiphenyl sulfone, 3,3'-diaminodiphenyl sulfone, 4,4'-diaminobiphenyl, 3,4'-diaminobiphenyl, 3,3'-diaminobiphenyl, 4,4'-diaminobenzophenone, 3,4'-diaminobenzophenone, 3,3'-diaminobenzophenone, 4,4'-diaminodiphenylmethane, 3,4'-diaminodiphenylmethane, 3,3'-diaminodiphenylmethane, 1,4-bis(4-aminophenoxy)benzene, 1,3-bis(4-aminophenoxy)benzene, 1,3-bis(3-aminophenoxy)benzene, bis[4-(4-aminophenoxy)phenyl] sulfone, bis[4-(3-aminophenoxy)phenyl] sulfone, 4,4-bis(4-aminophenoxy)biphenyl, 4,4-bis(3-aminophenoxy)biphenyl, bis[4-(4-aminophenoxy)phenyl] ether, bis[4-(3-aminophenoxy)phenyl] ether, 1,4-bis(4-aminophenyl)benzene, 1,3-bis(4-aminophenyl)benzene, 9,10-bis(4-aminophenyl)anthracene, 2,2-bis(4-aminophenyl)propane, 2,2-bis(4-aminophenyl)hexafluoropropane, 2,2-bis[4-(4-aminophenoxy)phenyl]propane, 2,2-bis[4-(4-aminophenoxy)phenyl]hexafluoropropane, 1,4-bis(3-aminopropyldimethylsilyl)benzene, o-tolidine sulfone, 9,9-bis(4-aminophenyl)fluorene, and these diamines in which a part of the hydrogen atoms on the benzene ring are substituted with a methyl group, an ethyl group, a methoxy group, an ethoxy group, a halogen, or the like, such as, for example, 3,3'-dimethyl-4,4'-diaminobiphenyl, 2,2'-dimethyl-4,4'-diaminobiphenyl, 3,3'-dimethyl-4,4'-diaminodiphenylmethane, 2,2'-dimethyl-4,4'-diaminodiphenylmethane, 3,3'-dimethoxy-4,4'-diaminobiphenyl, 3,3'-dichloro-4,4'-diaminobiphenyl, and mixtures of these diamines.

Furthermore, for the purpose of improving adhesion to various substrates, a diaminosiloxane such as, for example, 1,3-bis(3-aminopropyl) tetramethyldisiloxane or 1,3-bis(3-aminopropyl) tetraphenyldisiloxane can be copolymerized.

After completion of the reaction, if necessary, water absorbing precipitates of the dehydration condensation agent coexisting in the reaction mixture are filtered off. Subsequently, a poor solvent for the resulting polymer component, such as water, an aliphatic lower alcohol or a mixture thereof with water, is introduced into the reaction mixture to precipitate the polymer component and is further subjected to repeated re-dissolution, re-precipitation, or the like to purify the polymer component, followed by vacuum drying to isolate the desired polyimide precursor component.

In order to further improve the degree of purification, the polymer solution may be passed through a column packed with anion and cation exchange resins swelled with a suitable organic solvent to remove ionic impurities.

<Component B>

Next, the monomer having a photopolymerizable unsaturated double bond of the component B will be explained.

As the monomer having a photopolymerizable unsaturated double bond used as the component B of the negative type photosensitive resin composition of the present invention, (meth)acrylic compounds polymerizable with a photopolymerization initiator are preferred, and they include, for example, polyethylene glycol diacrylates (the number of each ethylene glycol unit being 2-20), polyethylene glycol dimethacrylates (the number of each ethylene glycol unit being 2-20), poly(1,2-propylene glycol) diacrylate, poly(1,2-propylene glycol) dimethacrylate, pentaerythritol diacrylate, pentaerythritol dimethacrylate, glycerol diacrylate, glycerol dimethacrylate, dipentaerythtirol hexacrylate, methylenebisacrylamide, N-methylolacrylamide, ethylene glycol diglycidyl ether-methacrylic acid adduct, glycerol diglycidyl ether-acrylic acid adduct, bisphenol A diglycidyl ether-acrylic acid adduct, bisphenol A diglycidyl ether-methacrylic acid adduct, and N,N'-bis(2-methacryloyloxyethyl)urea. The component B is not limited to these examples, and furthermore, these may be used each alone or in a combination or two or more.

The amount of the component B added is preferably 1-50 parts by mass with respect to the component A of the present invention. However, in case the component A of the present invention is a polybenzoxazole precursor, the amount of the component B is 10-50 parts by mass, preferably 20-50 parts by mass, more preferably 30-45 parts by mass. Further, in case the component A of the present invention is a polyimide precursor, the amount of the component B is 1-50 parts by mass, preferably 1-20 parts by mass, more preferably 1-10 parts by mass. If the amount of the component B is smaller than 1 part by mass, the crosslinking density in photopolymerization is too low and hence the photosensitivity is low.

Therefore, the relief pattern after development is highly swelled and practically usable relief patterns can hardly be obtained. If the amount exceeds 50 parts by mass, the crosslinking density in photopolymerization is too high and the scattered light from the surface of the substrate greatly affects the unexposed portions during exposure, and hence residues after development are apt to be present on the unexposed portions, which is not preferred.

<Component C>

Next, the photopolymerization initiator of the component C will be explained.

As the photopolymerization initiators used as the component C of the negative type photosensitive resin composition of the present invention, there may be preferably used, for example, the following compounds.

(a) Benzophenone and benzophenone derivatives such as methyl o-benzoylbenzoate, 4-benzoyl-4'-methyldiphenyl ketone, dibenzyl ketone and fluorenone, (b) acetophenones derivatives such as 2,2-diethoxyacetophenone, 2-hydroxy-2-methylpropiophenone and 1-hydroxycyclohexylphenyl ketone, (c) thioxanthone and thioxanthone derivatives such as 2-methylthioxanthone, 2-isopropylthioxanthone and diethylthioxanthone, (d) benzil and benzil derivatives such as benzildimethyl ketal and benzil-β-methoxyethylacetal, (e) benzoin and benzoin derivatives such as benzoinmethyl ether, (f) oximes such as 1-phenyl-1,2-butanedione-2-(o-methoxycarbonyl)oxime, 1-phenyl-1,2-propanedione-2-(o-methoxycarbonyl)oxime, 1-phenyl-1,2-propanedione-2-(o-ethoxycarbonyl)oxime, 1-phenyl-1,2-propanedione-2-(o-benzoyl)oxime, 1,3-diphenylpropanetrione-2-(o-ethoxycarbonyl)oxime and 1-phenyl-3-ethoxypropanetrione-2-(o-benzoyl)oxime. These may be used each alone or as a mixture of two or more.

Of the above photopolymerization initiators, the oximes of (f) are more preferred especially from the point of photosensitivity. The amount of the component C added is preferably 1-20 parts by mass, preferably 2-10 parts by mass, more preferably 4-8 parts by mass with respect to the component A of the present invention. This is because if the amount is smaller than 1 part by mass, radicals in an amount enough to allow the radical photopolymerization to proceed sufficiently are not provided at the time of exposure, and hence the photosensitivity is low, and therefore the pattern is highly swelled after development and practically usable relief patterns can hardly be obtained. Further, if the amount exceeds 20 parts by weight, absorption of exposure light around the surface of the coating is too large and hence the exposure light does not reach the surface of the substrate, resulting in nonuniform photocrosslinking in the thickness direction of the coating. Thus, practically usable relief patterns can also hardly be obtained.

<Component D>

Next, the melamine resin of the component D will be explained.

The melamine resin of the component D used in the present invention is a monomer having the structure represented by the following formula (7) or a mixture of the monomer and a polymer formed by polymerization of the monomer. The component D is a compound which can crosslink with the component A simultaneously with the heat cyclization treatment of the component A or which per se can form a crosslinked network, and when the component D is used in the negative type photosensitive resin composition of the present invention, the polybenzoxazole film and polyimide film after being subjected to heat curing treatment show excellent heat resistance, chemical resistance and high temperature flux resistance which have not hitherto been attained.

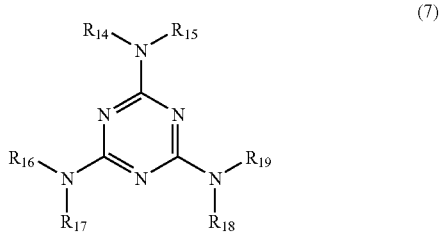

(where $R_{14}$-$R_{19}$ are independently a hydrogen atom or a monovalent organic group represented by the following formula (8):

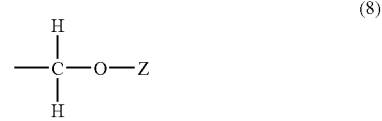

with the proviso that all of the substituents $R_{14}$-$R_{19}$ cannot be simultaneously hydrogen atoms, and the Z's are a hydrogen atom or an aliphatic group of 1-4 carbon atoms and all of them cannot be simultaneously hydrogen atoms).

$R_{14}$-$R_{19}$ in the formula (7) each represent independently a hydrogen atom, a hydroxymethyl group or an alkoxymethyl group, but the compound of the formula (7) where all of $R_{14}$-$R_{19}$ are hydrogen atoms, namely, melamine per se cannot be expected to exhibit the heat crosslinking effect which is to be exhibited by the component D in the present invention. The compounds which can be expected to exhibit the heat crosslinking effect are those in which at least two of $R_{14}$-$R_{19}$ are substituted with a hydroxymethyl group and/or an alkoxymethyl group, and with an increase of the degree of the substitution, intermolecular crosslinking efficiency of the polyamide and polybenzoxazole or polyimide which is a heat modification product of the polyamide of the present invention can be enhanced.

When a melamine resin having a substituent hydroxymethyl group is compared with that having a substituent alkoxymethyl group, the latter is lower in self-condensation ability and therefore can enhance the storage stability of the negative type photosensitive resin composition of the present invention and is more preferred.

Examples of suitable alkoxymethyl groups are a methoxymethyl group, an ethoxymethyl group, a n-propoxymethyl group, an iso-propoxymethyl group, a n-butoxymethyl group, a tert-butoxymethyl group, etc.

The substitution portion of this alkoxymethyl group may be of the structure of only one of the above suitable examples or in the form of a plurality of them being present, but considering stability or crosslinking efficiency, it is preferred that Z in the formula (8) is lower in molecular weight. Therefore, a melamine of the formula (7) where $R_{14}$-$R_{19}$ are all methoxymethyl groups, namely, hexamethoxymethylmelamine is most preferred as the component D in the present invention.

The melamine resin suitably usable in the present invention is a monomer, namely, it has the basic unit structure per se represented by the formula (7) when the polymerization degree is 1.0. When the polymerization degree exceeds 1.0, the melamine resin is a mixture of a monomer component which is the basic unit structure per se and a polymer component comprising a plurality of components of dimer or higher polymers in which a part of the nitrogen atoms bonding to the ring in the formula (7) link to nitrogen atoms bonding to the ring in the adjacent basic unit structure through a —$CH_2$— or a —$CH_2$—O—$CH_2$— structure. The polymerization degree is usually shown by a weighted average polymerization degree according to peak area ratio of GPC (gel permeation chromatography).

In the present invention, the above-mentioned suitably usable melamine resin, in the case of the polymerization degree (GPC peak area ratio weighted average polymerization degree) being more than 1.0, may be composed of only one component of that polymerization degree or may be a mixture of a monomer component and a plurality of polymer components of dimer or higher polymers, but the polymerization degree (GPC peak area ratio weighted average polymerization degree) is preferably not less than 1.0 and not more than 2.2.

This is because with an increase of the polymerization degree of the melamine resin, compatibility with the polyamide which is a main component decreases in the negative type photosensitive resin composition of the present invention, and hence the melamine resin per se is apt to agglomerate and simultaneously self-condensation between melamine resins is apt to occur. If the polymerization degree exceeds 2.2, the melamine resin component precipitates or there is a marked tendency to cause decrease of storage stability of the composition.

The amount of the component D is 5-30 part by mass, preferably 5-20 parts by mass, more preferably 8-15 parts by mass with respect to the polyamide component A of the present invention. If the amount is smaller than 5 parts by mass, the various effects of the present invention, namely, the effects of improved heat resistance and chemical resistance of the polybenzoxazole film or polyimide film are conspicuously lower. And, if the amount exceeds 30 parts by mass, although the various effects of the present invention are exerted sufficiently, the component D per se is apt to agglomerate in the photosensitive resin composition and simultaneously self-condensation between the melamine resins is apt to occur, and hence there is a marked tendency of recipitation of the melamine resin component or decrease in storage stability of the composition.

<Other Components>

In addition to the above four components, if necessary, a sensitizer can be added to the negative type photosensitive resin composition of the present invention in order to increase photosensitivity. The sensitizers include, for example, Michler's ketone, 4,4'-bis(diethylamino)benzophenone, 2,5-bis(4-diethylaminobenzylidene)cyclopentanone, 2,6-bis(4-diethylaminobenzylidene)cyclohexanone, 2,6-bis(4-dimethylaminobenzylidene)-4-methylcyclohexanone, 2,6-bis(4-diethylaminobenzylidene)-4-methylcyclohexanone, 4,4'-bis(dimethylamino)chalcone, 4,4'-bis(diethylamino)chalcone, 2-(4-dimethylaminocinnamylidene)indanone, 2-(4-dimethylaminobenzylidene)indanone, 2-(p-4-dimethylaminobiphenyl)benzothiazole, 1,3-bis(4-dimethylaminobenzylidene)acetone, 1,3-bis(4-diethylaminobenzylidene)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin, N-phenyl-N-ethylethanolamine, N-phenyldiethanolamine, N-p-tolyldiethanolamine, N-phenylethanolamine, 4-morpholinobenzophenone, isoamyl 4-dimethylaminobenzoate, isoamyl 4-diethylaminobenzoate, 2-mercaptobenzimidazole, 1-phenyl-5-mercapto-1,2,3,4-tetrazole, 1-cyclohexyl-5-mercapto-1,2,3,4-tetrazole, 1-(tert-butyl)-5-mercapto-1,2,3,4-tetrazole, 2-mercaptobenzothiazole, 2-(p-dimethylaminostyryl)benzoxazole, 2-(p-dimethylaminostyryl)benzothiazole, 2-(p-dimethylaminostyryl)naphtho(1,2-p)thiazole, and 2-(p-dimethylaminobenzoyl)styrene. These may be used each alone or as a mixture of two or more. The amount of the sensitizer added is preferably not more than 15 parts by mass with respect to the polyamide component although it depends on amounts of other additives.

Furthermore, a dilute solvent may be used in order to form a varnish of the negative type photosensitive resin composition, and such solvent components include, for example, N,N-dimethylformamide, N,N-dimethylacetamide, N-methyl-2-pyrrolidone, dimethyl sulfoxide, hexamethylphosphoramide, pyridine, γ-butyrolactone, α-acetyl-γ-butyrolactone, diethylene glycol monomethyl ether, diethylene glycol dimethyl ether, propylene glycol monomethyl ether, propylene glycol monomethyl ether acetate, ethyl lactate, and butyl lactate. These may be used each alone or as a mixture of two or more.

If necessary, a polymerization inhibitor can be added to the negative type photosensitive resin composition of the present invention in order to improve the stability of the viscosity or the photosensitivity of the composition solution during storage. As the polymerization inhibitors, there may be used, for example, hydroquinone, N-nitrosodiphenylamine, p-tert-butylcatechol, phenothiazine, N-phenylnaphthylamine, ethylenediaminetetraacetic acid, 1,2-cyclohexanediaminetetraacetic acid, glycol ether diaminetetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxyamine ammonium salt, N-nitroso-N-phenylhydroxylamine ammonium salt, N-nitroso-N-(1-naphthyl)hydroxylamine ammonium salt, and bis(4-hydroxy-3,5-tert-butyl)phenylmethane. The polymerization inhibitors are not limited to these examples. The amount of the polymerization inhibitor is preferably not more than 5 parts by mass with respect to the polyamide component of the present invention. If the amount exceeds 5 parts by mass, the photocrosslinking reaction per se which would inherently be expected is inhibited and may cause a decrease in photosensitivity.

In addition to the above additives, if necessary, there may be optionally added various additives to the photosensitive resin composition of the present invention, such as a scattered light absorber, a coating smoothing agent and a silane coupling agent, so long as they do not damage the various characteristics of the negative type photosensitive resin composition of the present invention.

Examples of the use of the negative type photosensitive resin composition of the present invention will be shown below.

First, the composition is coated on a suitable substrate such as a silicon wafer, a ceramics substrate or an aluminum substrate. As the coating method, there may be employed a spin coater, a spray coater, dipping, printing, a blade coater, a roll coating, etc. The coating is dried by pre-baking it at 80-120° C. and then it is irradiated with actinic rays through a desired photomask using an exposing projector such as a contact aligner, a mirror projection or a stepper.

As the actinic rays, there may be used X-rays, electronic rays, ultraviolet rays, visible rays, etc., and those having a wavelength of 200-500 nm are preferred in the present invention. From the points of resolution of pattern and handleability, the light source wavelength is especially preferably UV-i line (365 nm), and a stepper is preferred as the exposing projector.

Thereafter, if necessary, post-exposure baking (PEB) or pre-development baking with optional combination of temperature and time (preferably temperature: 40-120° C. and time: 10-240 seconds) may be carried out for the purpose of improving photosensitivity.

Then, development is carried out, and this can be performed by a method selected from a dipping method, a paddle method, a rotational spray method, etc.

As the developers, when the coating film comprises an alkali-soluble polybenzoxazole precursor composition of the present invention, there may be used aqueous solutions of inorganic alkalis such as sodium hydroxide, sodium carbonate, sodium silicate and aqueous ammonia, organic amines such as ethylamine, diethylamine, triethylamine and triethanolamine, quaternary ammonium salts such as tetramethylammonium hydroxide and tetrabutylammonium hydroxide, and furthermore these aqueous solutions to which water-soluble organic solvents such as methanol and ethanol or surface active agents are added in a suitable amount.

When the coating film comprises a polyimide precursor composition of the present invention, as the developers, there may be used good solvents for the precursor each alone or as an optional mixture of a good solvent and a poor solvent. As the good solvents, there may be used N-methyl-2-pyrrolidone, N-acetyl-2-pyrrolidone, N,N-dimethylacetamide, N,N-dimethylformamide, dimethyl sulfoxide, γ-butyrolactone, α-acetyl-γ-butyrolactone, cyclopentanone, cyclohexane, etc., and as the poor solvents, there may be used toluene, xylene, methanol, ethanol, isopropanol, propylene glycol monomethyl ether acetate, propylene glycol monomethyl ether, water, etc. When the good solvent and the poor solvent are used in admixture, the mixing ratio is adjusted depending on the dissolvability of the coating film of the polyimide precursor composition or the developing method.

After completion of the development, the developer is removed by washing with a rinsing solution to obtain a film having a negative type pattern. As the rinsing solution, there may be used distilled water, methanol, ethanol, isopropanol, toluene, xylene, propylene glycol monomethyl ether acetate, propylene glycol monomethyl ether, etc. These may be used each alone or as an optional mixture, or in stepwise combinations.

The thus obtained coated film of polyamide with pattern is converted to a polybenzoxazole film or polyimide film excellent in heat resistance and chemical resistance by heating to 200° C. or higher to allow a dehydration cyclization reaction to proceed or by simultaneous occurrence of crosslinking. The above heat cyclization treatment can be performed by using a hot plate, an inert oven, or a programmed-temperature oven in which a temperature program can be set. As a gas of the atmosphere for the heat cyclization, air can be used, and, furthermore, an inert gas such as nitrogen or argon may be used.

A semiconductor device can be produced using the above-mentioned polyamide-containing negative type photosensitive resin composition. Furthermore, a semiconductor device can be produced using the method for the formation of relief patterns with the above polybenzoxazole film or polyimide film.

Examples of embodiments of the present invention will be explained in detail below.

REFERENCE EXAMPLE 1

Synthesis of Polybenzoxazole Precursor PBO-1

In a separable flask of 2 L in capacity, 436 g of N,N-dimethylacetamide (DMAc), 13.45 g (0.17 mol) of pyridine and 124.53 g (0.34 mol) of 2,2-bis(3-amino-4-hydroxyphenyl)hexafluoropropane (6FAP) were mixed by stirring at room temperature (24° C.) to carry out dissolution. To the resulting solution was dropped a solution separately prepared by dissolving 82.63 g (0.28 mol) of diphenyl ether-4,4'-dicarbonyl dichloride (DEDC) in 248 g of diethylene glycol dimethyl ether (DMDG) from a dropping funnel. In this case, the separable flask was cooled with a water bath of 15-20° C. Twenty minutes were required for the dropping, and the temperature of the reaction mixture was 30° C. at maximum.

After completion of the dropping, the reaction mixture was stirred and left to stand for 1 hour, and then the reaction mixture was dropped to 5 L of water while stirring at a high speed to disperse and precipitate the resulting polymer, which was recovered, suitably washed with water, dehydrated and then vacuum dried to obtain a polybenzoxazole precursor having amino groups at both terminals. This polymer had a GPC weight-average molecular weight calculated in terms of polystyrene (THF solvent) of 10300, a remaining solvent ratio of 13.95% and a yield of 86.51%.

REFERENCE EXAMPLE 2

Synthesis of Photosensitive Polybenzoxazole Precursor PSP-1

An organic group having a photopolymerizable unsaturated double bond was introduced into the PBO-1 obtained in Reference Example 1 by the following method.

100 g of a dry powder of PBO-1 was charged in a separable flask of 1 L in capacity, and 400 g of γ-butyrolactone (GBL) was added thereto to redissolve the powder, followed by adding 0.85 g of dibutyltin dilaurate and heating to 50° C. with an oil bath. Therein was dropped over 15 minutes a solution separately prepared by dissolving 16.94 g (0.109 mol) of 2-isocyanatoethyl methacrylate (which corresponded to 35 mol % of total hydroxyl groups of PBO-1 according to calculation from the yield of PBO-1 and the amount of PBO-1 used for the reaction) in 51 g of GBL.

After completion of the dropping, stirring was carried out at 50° C. for 4 hours. After a lapse of 4 hours, this reaction mixture was dropped into 4 L of deionized water, and the precipitated polymer was separated and washed, and then vacuum dried at 50° C. for 24 hours to obtain a photosensitive polybenzoxazole precursor PSP-1 having photopolymerizable unsaturated double bond.

In this reaction, since the isocyanate predominantly reacted with the amino groups at the polymer terminals while it also reacted with hydroxyl groups in the polymer skeleton, there was provided a structure where the methacrylate groups are introduced through a urea bond at the polymer terminal and through a urethane bond at a part of the hydroxyl group portions in the skeleton.

The introduction proportion of a methacrylate group based on the whole skeleton can be obtained by measuring $^1$H-NMR spectrum of the polymer and calculating from the ratio of the sum of integrated intensities derived from hydrogen atoms on the aromatic ring of the repeating unit portions of the skeleton to the integrated intensity derived from two hydrogen atoms of the end portion of the carbon-carbon double bond in the introduced methacrylate group. In the case of this example, the introduction proportion of the methacrylate group calculated was 28.6% based on the total hydroxyl groups in the skeleton. That is, PSP-1 was a compound where when the total mol of $R_1$ and $R_2$ in the formula (4) was assumed to be 100 mol %, 28.6 mol % of $R_1$ and $R_2$ were monovalent organic groups represented by the above formula (3) having a photopolymerizable unsaturated double bond.

REFERENCE EXAMPLE 3

Synthesis of Photosensitive Polybenzoxazole Precursor PSP-2

An organic group having a photopolymerizable unsaturated double bond was introduced into the PBO-1 obtained in Reference Example 1 by the following method.

100 g of a dry powder of PBO-1 was charged in a separable flask of 1 L in capacity, and 400 g of γ-butyrolactone (GBL) was added thereto to redissolve the powder, followed by adding 1.57 g of dibutyltin dilaurate and heating to 50° C. with an oil bath. Therein was dropped over 30 minutes a solution separately prepared by dissolving 31.35 g (0.202 mol) of 2-isocyanatoethyl methacrylate (which corresponded to 65 mol % of total hydroxyl groups of PBO-1 according to calculation from the yield of PBO-1 and the amount of PBO-1 used for the reaction) in 94 g of GBL. After completion of the dropping, stirring was carried out at 50° C. for 4 hours. After a lapse of 4 hours, this reaction mixture was dropped into 4 L of deionized water, and the precipitated polymer was separated and washed, and then vacuum dried at 50° C. for 24 hours to obtain a photosensitive polybenzoxazole precursor PSP-2.

The introduction proportion of a methacrylate group calculated in the same manner as in Reference Example 2 was 55.3% based on the total hydroxyl groups in the skeleton. That is, PSP-2 was a compound where when the total mol of $R_1$ and $R_2$ in the formula (4) was assumed to be 100 mol %, 55.3 mol % of $R_1$ and $R_2$ were monovalent organic groups having a photopolymerizable unsaturated double bond and represented by the formula (3).

REFERENCE EXAMPLE 4

Synthesis of Photosensitive Polybenzoxazole Precursor PSP-3

An organic group having a photopolymerizable unsaturated double bond was introduced into the PBO-1 obtained in Reference Example 1 by the following method.

100 g of a dry powder of PBO-1 was charged in a separable flask of 1 L in capacity, and 400 g of γ-butyrolactone (GBL) was added thereto to redissolve the powder, followed by adding 0.24 g of dibutyltin dilaurate and heating to 50° C. with an oil bath. Therein was dropped over 10 minutes a solution separately prepared by dissolving 4.81 g (0.031 mol) of 2-isocyanatoethyl methacrylate (which corresponded to 10 mol % of total hydroxyl groups of PBO-1 according to calculation from the yield of PBO-1 and the amount of PBO-1 used for the reaction) in 15 g of GBL. This reaction mixture was dropped into 4 L of deionized water, and the precipitated polymer was separated and washed, and then vacuum dried at 50° C. for 24 hours to obtain a photosensitive polybenzoxazole precursor PSP-3.

The introduction proportion of a methacrylate group calculated in the same manner as in Reference Example 2 was 8.3% based on the total hydroxyl groups in the skeleton. That is, PSP-3 was a compound where when the total mol of $R_1$ and $R_2$ in the formula (4) was assumed to be 100 mol %, 8.3 mol % of $R_1$ and $R_2$ were monovalent organic groups having a photopolymerizable unsaturated double bond and represented by the formula (3).

REFERENCE EXAMPLE 5

Synthesis of Photosensitive Polyimide Precursor PSP-4

In a separable flask of 5 L in capacity were charged 310.22 g (1.00 mol) of diphenyl ether-3,3',4,4'-tetracarboxylic acid dianhydride, 270.69 g (2.08 mols) of 2-methacryloyloxyethyl alcohol, 158.2 g (2.00 mols) of pyridine and 1000 g of GBL, followed by mixing, stirring at room temperature for 16 hours and being left to stand. Therein was dropped over about 30 minutes under ice cooling a diluted solution prepared by dissolving 400.28 g (1.94 mols) of dicyclohexylcarbodiimide in 400 g of GBL, followed by adding thereto over about 60 minutes a dispersion prepared by dispersing 185.97 g (0.93 mol) of 4,4'-diaminodiphenyl ether in 650 g of GBL. Stirring was carried out for 3 hours while ice cooling, then 50 g of ethanol was added, and the ice cooling bath was removed, followed by further stirring for 1 hour, and leaving it. A solid matter (dicyclohexylurea) precipitated in the above process was filtered off under application of pressure, then the reaction mixture was added dropwise to 40 L of ethanol, and the precipitated polymer was separated and washed, and then vacuum dried at 50° C. for 24 hours to obtain a photosensitive polyimide precursor PSP-4. The GPC weight-average molecular weight (THF solvent) calculated in terms of polystyrene was 22000.

REFERENCE EXAMPLE 6

Synthesis of Photosensitive Polyimide Precursor PSP-5

In a separable flask of 5 L in capacity were charged 65.44 g (0.30 mol) of pyromellitic anhydride, 225.56 g (0.70 mol) of benzophenone-3,3',4,4'-tetracarboxylic acid dianhydride, 270.69 g (2.08 mols) of 2-methacryloyloxyethyl alcohol, 158.2 g (2.00 mols) of pyridine and 1000 g of GBL, followed by mixing, stirring at room temperature for 16 hours and being left to stand. Therein was dropped over about 30 minutes under cooling with ice a diluted solution prepared by dissolving 412.66 g (2.00 mols) of dicyclohexylcarbodiimide in 400 g of GBL, followed by adding thereto over about 60 minutes a dispersion prepared by dispersing 185.97 g (0.93 mol) of 4,4'-diaminodiphenyl ether in 650 g of GBL. Stirring was carried out for 3 hours while ice cooling, and then 50 g of ethanol was added, the ice cooling bath was removed, followed by further stirring for 1 hour at room temperature, and leaving it. A solid matter (dicyclohexylurea) precipitated in the above process was filtered off under application of pressure, then the reaction mixture was dropped to 40 L of ethanol, and the precipitated polymer was separated and washed, and then vacuum dried at 50° C. for 24 hours to obtain a photosensitive polyimide precursor PSP-5. The GPC weight-average molecular weight (THF solvent) calculated in terms of polystyrene was 30000.

EXAMPLE 1

To 100 parts by mass of the photosensitive polybenzoxazole precursor (PSP-1) were added 16 parts by mass of tetraethylene glycol dimethacrylate, 16 parts by mass of N,N'-bis(2-methacryloyloxyethyl)urea, 6 parts by mass of 1-phenyl-1,2-propanedione-2-(O-benzoyl)oxime, 10 parts by mass of hexamethoxymethylated melamine resin (manufactured by Sanwa Chemical Co., Ltd.; trademark: NIKA-LAC; product number: MW-30HM; polymerization degree: 1.0), 2 parts by mass of 1-phenyl-5-mercapto-1,2,3,4-tetrazole, 1 part by mass of 4,4'-bis(diethylamino)benzophenone and 0.1 part by mass of N-nitrosodiphenylamine, and the mixture was dissolved in 220 parts by mass of N-methyl-2-pyrrolidone (NMP) to obtain a varnish of a negative type photosensitive resin composition.

EXAMPLE 2

To 100 parts by mass of the photosensitive polybenzoxazole precursor (PSP-1) were added 16 parts by mass of tetraethylene glycol dimethacrylate, 16 parts by mass of N,N'-bis(2-methacryloyloxyethyl)urea, 6 parts by mass of 1-phenyl-1,2-propanedione-2-(O-benzoyl)oxime, 10 parts by mass of hexamethoxymethylated melamine resin (manufactured by Sanwa Chemical Co., Ltd.; trademark: NIKA-LAC; product number: MW-30HM; polymerization degree: 1.0), 2 parts by mass of Michler's ketone and 0.1 part by mass of N-nitrosodiphenylamine, and the mixture was dissolved in 220 parts by mass of N-methyl-2-pyrrolidone (NMP) to obtain a varnish of a negative type photosensitive resin composition.

EXAMPLES 3-7 AND COMPARATIVE EXAMPLES 1-3

Varnishes of photosensitive resin compositions were obtained in the same manner as in Example 2, except that the melamine resins and the amounts thereof were as shown in Table 1.

COMPARATIVE EXAMPLES 4-8

Varnishes of negative type photosensitive resin compositions were obtained in the same manner as in Example 2, except that the kinds of the polyamide having a photopolymerizable unsaturated double bond, the monomers having a photopolymerizable unsaturated double bond and the photopolymerization initiators which were the component A, the component B and the component C of the present invention, respectively, and the amounts thereof were as shown in Table 2.

EXAMPLE 8

To 100 parts by mass of the photosensitive polyimide precursor (PSP-4) were added 4 parts by mass of tetraethylene glycol dimethacrylate, 4 parts by mass of 1,3-diphenylpropanetrione-2-(O-ethoxycarbonyl)oxime, 10 parts by mass of hexamethoxymethylated melamine resin (manufactured by Sanwa Chemical Co., Ltd.; trademark: NIKALAC; product number: MW-30HM; polymerization degree: 1.0), 1 part by mass of 1-phenyl-5-mercapto-1,2,3,4-tetrazole, 4 part by mass of N,N-bis(2-hydroxyethyl)aniline and 0.05 part by mass of N-nitrosodiphenylamine, and the mixture was dissolved in a mixed solvent comprising 105 parts by mass of N-methyl-2-pyrrolidone (NMP) and 45 parts by mass of ethyl lactate to obtain a varnish of a negative type photosensitive resin composition.

EXAMPLES 9-13 AND COMPARATIVE EXAMPLE 9-11

Varnishes of negative type photosensitive resin compositions were obtained in the same manner as in Example 8, except that the kinds of the melamine resins and the amounts thereof were as shown in Table 1.

COMPARATIVE EXAMPLES 12-14

Varnishes of negative type photosensitive resin compositions were obtained in the same manner as in Example 8, except that the kinds of the polyamide having a photopolymerizable unsaturated double bond, the monomers having a photopolymerizable unsaturated double bond and the photopolymerization initiators which were the component A, the component B and the component C of the present invention, respectively, and the amounts thereof were as shown in Table 2.

EXAMPLE 14

To a mixture of 70 parts by mass of the photosensitive polyimide precursor (PSP-4) and 30 parts by mass of the photosensitive polyimide precursor (PSP-5) were added 4 parts by mass of tetraethylene glycol dimethacrylate, 4 parts by mass of 1,3-diphenylpropanetrione-2-(O-ethoxycarbonyl)oxime, 10 parts by mass of hexamethoxymethylated melamine resin (manufactured by Sanwa Chemical Co., Ltd.; trademark: NIKALAC; product number: MW-30HM; polymerization degree: 1.0), 1 part by mass of 1-phenyl-5-mercapto-1,2,3,4-tetrazole, 4 parts by mass of N,N-bis(2-hydroxyethyl)aniline and 0.05 part by mass of N-nitrosodiphenylamine, and the mixture was dissolved in a mixed solvent comprising 105 parts by mass of N-methyl-2-pyrrolidone (NMP) and 45 parts by mass of ethyl lactate to obtain a varnish of a negative type photosensitive resin composition.

EXAMPLES 15-19 AND COMPARATIVE EXAMPLES 15-17

Varnishes of negative type photosensitive resin compositions were obtained in the same manner as in Example 14, except that the kinds of the melamine resins and the amounts thereof were as shown in Table 1.

COMPARATIVE EXAMPLES 18-20

Varnishes of negative type photosensitive resin compositions were obtained in the same manner as in Example 14, except that the kinds of the polyamide having a photopolymerizable unsaturated doublebond, the monomers having a photopolymerizable unsaturated double bond and the photopolymerization initiators which were the component A, the component B and the component C of the present invention, respectively, and the amounts thereof were as shown in Table 2.

COMPARATIVE EXAMPLE 21

A varnish of a negative type photosensitive resin composition was obtained in the same manner as in Example 2, except that in place of the melamine resin, EPOLITE 3002 (manufactured by Kyoeisha Chemical Co., Ltd.) as an epoxy crosslinking agent was used in an amount of 10 parts by mass based on the polyamide component.

COMPARATIVE EXAMPLE 22

A varnish of a negative type photosensitive resin composition was obtained in the same manner as in Example 2, except that in place of the melamine resin, triallyl isocyanurate was used in an amount of 10 parts by mass based on the polyamide component.

COMPARATIVE EXAMPLE 23

A varnish of a negative type photosensitive resin composition was obtained in the same manner as in Example 8, except that in place of the melamine resin, EPOLITE 3002 (manufactured by Kyoeisha Chemical Co., Ltd.) as an epoxy crosslinking agent was used in an amount of 10 parts by mass based on the polyamide component.

COMPARATIVE EXAMPLE 24

A varnish of a negative type photosensitive resin composition was obtained in the same manner as in Example 8, except that in place of the melamine resin, triallyl isocyanurate was used in an amount of 10 parts by mass based on the polyamide component.

COMPARATIVE EXAMPLE 25

A varnish of a negative type photosensitive resin composition was obtained in the same manner as in Example 14, except that in place of the melamine resin, EPOLITE 3002 (manufactured by Kyoeisha Chemical Co., Ltd.) as an epoxy crosslinking agent was used in an amount of 10 parts by mass based on the polyamide component.

COMPARATIVE EXAMPLE 26

A varnish of a negative type photosensitive resin composition was obtained in the same manner as in Example 14, except that in place of the melamine resin, triallyl isocyanurate was used in an amount of 10 parts by mass based on the polyamide component.

TABLE 1

| | Melamine resin | Maker | Trademark | Product Number | Polymerization degree | Amount* (parts by mass) |
|---|---|---|---|---|---|---|
| Example 1 | Hexamethoxymethylated melamine resin | Sanwa Chemical | NIKALAC | MW-30HM | 1.0 | 10 |
| Example 2 | Hexamethoxymethylated melamine resin | Sanwa Chemical | NIKALAC | MW-30HM | 1.0 | 10 |
| Example 3 | Hexamethoxymethylated melamine resin | Sanwa Chemical | NIKALAC | MW-390 | 1.0 | 10 |
| Example 4 | Methoxymethylated melamine resin | Sanwa Chemical | NIKALAC | MW-100LM | 1.3 | 10 |
| Example 5 | Methoxymethylated melamine resin | Mitsui Cytec | CYMEL | 303 | 1.7 | 10 |
| Example 6 | Methoxy/butoxy mixed methylated melamine resin | Mitsui Cytec | CYMEL | 235 | 1.4 | 10 |
| Example 7 | Butoxymethylated melamine resin | Mitsui Cytec | MYCOAT | 506 | 2.2 | 10 |
| Example 8 | Hexamethoxymethylated melamine resin | Sanwa Chemical | NIKALAC | MW-30HM | 1.0 | 10 |
| Example 9 | Methoxymethylated melamine resin | Mitsui Cytec | CYMEL | 303 | 1.7 | 10 |
| Example 10 | Methoxy/butoxy mixed methylated melamine resin | Mitsui Cytec | CYMEL | 235 | 1.4 | 10 |
| Example 11 | Butoxymethylated melamine resin | Mitsui Cytec | MYCOAT | 506 | 2.2 | 10 |
| Example 12 | Methoxymethylated melamine resin | Sanwa Chemical | NIKALAC | MW-100LM | 1.3 | 10 |
| Example 13 | Hexamethoxymethylated melamine resin | Sanwa Chemical | NIKALAC | MW-390 | 1.0 | 10 |
| Example 14 | Hexamethoxymethylated melamine resin | Sanwa Chemical | NIKALAC | MW-30HM | 1.0 | 10 |
| Example 15 | Methoxymethylated melamine resin | Mitsui Cytec | CYMEL | 303 | 1.7 | 10 |
| Example 16 | Methoxy/butoxy mixed methylated melamine resin | Mitsui Cytec | CYMEL | 235 | 1.4 | 10 |
| Example 17 | Butoxymethylated melamine resin | Mitsui Cytec | MYCOAT | 506 | 2.2 | 10 |
| Example 18 | Methoxymethylated melamine resin | Sanwa Chemical | NIKALAC | MW-100LM | 1.3 | 10 |
| Example 19 | Hexamethoxymethylated melamine resin | Sanwa Chemical | NIKALAC | MW-390 | 1.0 | 10 |
| Comparative Example 1 | None | — | — | — | — | 0 |
| Comparative Example 2 | Methoxymethylated melamine resin | Sanwa Chemical | NIKALAC | MW-100LM | 1.3 | 3 |

TABLE 1-continued

| | Melamine resin | Maker | Trademark | Product Number | Polymerization degree | Amount* (parts by mass) |
|---|---|---|---|---|---|---|
| Comparative Example 3 | Methoxymethylated melamine resin | Sanwa Chemical | NIKALAC | MW-100LM | 1.3 | 40 |
| Comparative Example 9 | None | — | — | — | — | 0 |
| Comparative Example 10 | Methoxymethylated melamine resin | Sanwa Chemical | NIKALAC | MW-100LM | 1.3 | 3 |
| Comparative Example 11 | Methoxymethylated melamine resin | Sanwa Chemical | NIKALAC | MW-100LM | 1.3 | 40 |
| Comparative Example 15 | None | — | — | — | — | 0 |
| Comparative Example 16 | Methoxymethylated melamine resin | Sanwa Chemical | NIKALAC | MW-100LM | 1.3 | 3 |
| Comparative Example 17 | Methoxymethylated melamine resin | Sanwa Chemical | NIKALAC | MW-100LM | 1.3 | 40 |

*The amount is part by mass based on the component A of the present invention, polyamide.

TABLE 2

| | Component A (part by mass) | Component B (part by mass) | Component C (part by mass) |
|---|---|---|---|
| Comparative Example 4 | PSP-3(100) | 4EM(16)BMU(16) | PDO(6) |
| Comparative Example 5 | PSP-2(100) | 4EM(16)BMU(16) | PDO(6) |
| Comparative Example 6 | PSP-1(100) | 4EM(30)BMU(30) | PDO(6) |
| Comparative Example 7 | PSP-1(100) | 4EM(16)BMU(16) | PDO(0.5) |
| Comparative Example 8 | PSP-1(100) | 4EM(16)BMU(16) | PDO(25) |
| Comparative Example 12 | PSP-4(100) | 4EM(55) | PTO(4) |
| Comparative Example 13 | PSP-4(100) | 4EM(4) | PTO(0.5) |
| Comparative Example 14 | PSP-4(100) | 4EM(4) | PTO(25) |
| Comparative Example 18 | PSP-4(70)PSP-5(30) | 4EM(55) | PTO(4) |
| Comparative Example 19 | PSP-4(70)PSP-5(30) | 4EM(4) | PTO(0.5) |
| Comparative Example 20 | PSP-4(70)PSP-5(30) | 4EM(4) | PTO(35) |

4EM: Tetraethylene glycol dimethacrylate
BMU: N,N'-bis(2-methaycryloyloxyethyl)urea
PDO: 1-Phenyl-1,2-propanedione-2-(O-benzoyl)oxime
PTO: 1,3-Diphenylpropanetrione-2-(O-ethoxycarbonyl)oxime 4EM: Tetraethylene glycol dimethacrylate BMU: N, N'-bis(2-methacryloyloxyethyl)urea PDO: 1-Phenyl-1,2-propanedione-2,(O-benzoyl)oxime PTO: 1,3-Diphenylpropanetrione-2-(O-ethoxycarbonyl)oxime (Preparation of Polyamide Coating Film and Lithographic Evaluation)

Each of the varnishes of negative type photosensitive resin compositions obtained in the above Examples and Comparative Examples was coated on a silicon wafer of 5 inches pretreated with 3-aminopropyltriethoxysilane by a spin coater (model name: CLEAN TRACK MARK 7 manufactured by Tokyo Electron Co., Ltd.) and pre-baked at 95° C. for 3 minutes to obtain a coating film of 10 microns in initial film thickness.

This coating film was exposed at an exposure in the range of 50-500 mJ/cm$^2$ which was changed stepwise through a photomask for evaluation by an i-line stepper exposing machine (model name: NSR2005i8A manufactured by Nikon Co., Ltd.). After lapse of 60 seconds from the completion of the exposure, the film was subjected to post-exposure baking (PEB) at 70° C. for 90 seconds using a hot plate.

Thereafter, the coating films of the compositions of Examples 1-7, Comparative Examples 1-8 and Comparative Examples 21-22 were subjected to a paddle development using a 2.38% aqueous tetramethylammonium hydroxide solution (manufactured by Clariant Japan Co., Ltd.; product number: AZ300MIF) over a period calculated by multiplying the time required for complete dissolution and disappearance of the unexposed portions by 1.4, and subsequently the developed films were rinsed for 20 seconds with pure water to obtain coating films with negative patterns.

Moreover, the coating films of the compositions of Examples 8-19, Comparative Examples 9-20 and Comparative Examples 23-26 were subjected to a rotational spray development using a mixed solvent of γ-butyrolactone and xylene at 50/50 (v/v %) for a period calculated by multiplying the time required for complete dissolution and disappearance of the unexposed portions by 1.4, and subsequently the developed films were rinsed for 20 seconds with isopropanol to obtain coating films with negative patterns.

The obtained coating films with patterns were observed under a light microscope, and evaluation was conducted on the minimum exposure for obtaining a sharp relief pattern with causing no swelling (sensitivity), resolution of via holes (rectangular portions dissolved by development) at the time of irradiation with minimum exposure (resolution), presence of agglomeration and precipitation matters or residues after the development, etc. Furthermore, film thickness in pattern before and after the development in the case of exposure of 150 mJ/cm$^2$ was measured and the rate of change (film remaining ratio after development) was calculated. The results are shown in Table 3.

TABLE 3

| | Sensitivity (mJ/cm$^2$) | Resolution (μm) | Precipitate | Residue | Film remaining ratio after development (%) |
|---|---|---|---|---|---|
| Example 1 | 110 | 4 | ○ | ○ | 82 |
| Example 2 | 120 | 4 | ○ | ○ | 81 |
| Example 3 | 110 | 3.5 | ○ | ○ | 85 |
| Example 4 | 120 | 4.5 | ○ | ○ | 80 |
| Example 5 | 120 | 4.5 | ○ | ○ | 82 |
| Example 6 | 130 | 4.5 | ○ | ○ | 78 |
| Example 7 | 150 | 6 | ○ | ○ | 72 |
| Example 8 | 100 | 5 | ○ | ○ | 90 |
| Example 9 | 110 | 5 | ○ | ○ | 91 |
| Example 10 | 110 | 5 | ○ | ○ | 90 |
| Example 11 | 130 | 7.5 | ○ | ○ | 83 |
| Example 12 | 110 | 5 | ○ | ○ | 92 |
| Example 13 | 100 | 4.5 | ○ | ○ | 95 |
| Example 14 | 130 | 6 | ○ | ○ | 90 |
| Example 15 | 130 | 6.5 | ○ | ○ | 93 |
| Example 16 | 140 | 6.5 | ○ | ○ | 91 |
| Example 17 | 150 | 7.5 | ○ | ○ | 82 |
| Example 18 | 130 | 6 | ○ | ○ | 90 |
| Example 19 | 110 | 5 | ○ | ○ | 96 |
| Comparative Example 1 | 120 | 4 | ○ | ○ | 78 |
| Comparative Example 2 | 120 | 4 | ○ | ○ | 80 |
| Comparative Example 3 | 130 | 12 | X | X | 79 |
| Comparative Example 4 | 500 or higher | Not resolved | ○ | X | 46 |
| Comparative Example 5 | 200 | 25 | ○ | X | 89 |
| Comparative Example 6 | 130 | 16 | ○ | Δ | 78 |
| Comparative Example 7 | 450 | 22 | ○ | X | 51 |
| Comparative Example 8 | 100 | 18 | ○ | X | 83 |
| Comparative Example 9 | 110 | 5 | ○ | ○ | 90 |
| Comparative Example 10 | 100 | 5 | ○ | ○ | 91 |
| Comparative Example 11 | 110 | 9 | X | X | 91 |
| Comparative Example 12 | 130 | 20 | ○ | X | 76 |
| Comparative Example 13 | 460 | 28 | ○ | X | 49 |
| Comparative Example 14 | 100 | 18 | ○ | X | 92 |
| Comparative Example 15 | 130 | 6 | ○ | ○ | 93 |
| Comparative Example 16 | 130 | 6 | ○ | ○ | 91 |
| Comparative Example 17 | 140 | 12 | X | X | 91 |
| Comparative Example 18 | 160 | 25 | ○ | X | 72 |
| Comparative Example 19 | 460 | 30 | ○ | X | 42 |
| Comparative Example 20 | 100 | 22 | ○ | X | 92 |
| Comparative Example 21 | 150 | 6 | ○ | ○ | 75 |
| Comparative Example 22 | 140 | 6 | ○ | ○ | 81 |
| Comparative Example 23 | 150 | 7 | ○ | ○ | 85 |
| Comparative Example 24 | 150 | 6.5 | ○ | ○ | 90 |
| Comparative Example 25 | 170 | 7.5 | ○ | ○ | 87 |
| Comparative Example 26 | 160 | 7 | ○ | ○ | 93 |

Indication for evaluation on precipitate and residue
○: None
Δ: Slight
X: Much (Evaluation of Heat Resistance)

Each of the varnishes of the Examples and Comparative Examples was coated on a silicon wafer of 5 inches and pre-baked in the same manner as in the above-mentioned lithographic evaluation, and then was subjected to a heat curing treatment at 350° C. for 2 hours in a nitrogen atmosphere using a vertical curing furnace (model name: VF-2000B manufactured by Koyo Lindbergh Co., Ltd.) to obtain a polybenzoxazole film of 5 μm in film thickness and a polyimide film of 5 μm in film thickness. The film was cut to 3.0 mm in width using a dicing saw (model name: DAD-2H/6T manufactured by Disco Co., Ltd.) and immersed in an aqueous hydrofluoric acid solution and then peeled off from the silicon wafer to obtain a strip-like film sample.

The glass transition temperature (Tg) of this film sample was measured by a heat mechanical analyzing apparatus (model name: TMA-50 manufactured by Shimadzu Seisakusho Ltd.), and was used as an indication of the heat resistance of the polybenzoxazole film and the polyimide film. The measuring conditions were as follows: sample length: 10 mm; constant load: 200 g/mm$^2$; range of measuring temperature: 25-450° C.; heating rate: 10° C./min; and nitrogen atmosphere. The results are shown in Table 4.

(Evaluation of Chemical Resistance)

The coating film with pattern obtained in the above lithographic evaluation was set in the above vertical curing furnace and subjected to a heat curing treatment at 350° C. for 2 hours in a nitrogen atmosphere to obtain a polybenzoxazole film and a polyimide film of 5 μm in film thickness having patterns. This was immersed in a resist peeling solution (product number: 105 manufactured by Tokyo Ohka Kogyo Co., Ltd.) heated to 85° C. for 1 hour. After cooling, the film was washed with water and dried, and observed by a light microscope to examine damages of the patterns, mainly, presence of cracks and wrinkles.

Furthermore, the thickness of the film before and after immersing in the solution was measured, and the rate of change of the thickness (film thickness changing rate) was calculated. The results are shown in Table 4.

(Evaluation of High-Temperature Flux Resistance)

The same polybenzoxazole film and polyimide film with patterns as in the evaluation of chemical resistance were prepared, and a flux (trademark: SOLBOND, product number: R5003 manufactured by Japan Alpha Metals Co., Ltd.) was spin coated on the film (20 seconds at 500 revolutions). The film was heated to a peak temperature of 380° C. in a nitrogen atmosphere under simulative solder reflow conditions using a mesh belt type continuous firing furnace (model name: 6841-20AMC-36 manufactured by Koyo Lindbergh Co., Ltd.).

In this case, standard of temperature profiles such as heating rate, residence time at about peak temperature and cooling rate are important for ensuring objectivity of evaluation, and they were standardized with assuming the solder melting point to be a high temperature of 310° C. in accordance with solder reflow conditions mentioned in paragraph 7.6 of IPC/JEDEC J-STD-020A which is a standard specification of U.S. Semiconductor Industrial Organization relating to evaluation method for semiconductor devices.

The film after being subjected to the above simulative reflow treatment was immersed in xylene for 10 minutes and then in 2-propanol for 10 minutes and then was left to stand to remove flux, followed by drying and then observed by a light microscope to examine the occurrence of damages to the patterns, mainly, the occurrence of cracks and wrinkles.

Furthermore, the thickness of the film before and after being subjected to a series of the treatments was measured, and the rate of change (film thickness changing rate) was calculated. The results are shown in Table 4.

TABLE 4

|  | Chemical resistance (85° C. * 60 min) | | High-temperature flux resistance (380° C.) | | |
|---|---|---|---|---|---|
|  | Crack | Film thickness changing rate (%) | Crack | Film thickness changing rate (%) | Tg(° C.) |
| Example 1 | ○ | 101 | ○ | 105 | 388 |
| Example 2 | ○ | 102 | ○ | 105 | 388 |
| Example 3 | ○ | 100 | ○ | 101 | 393 |
| Example 4 | ○ | 103 | ○ | 106 | 386 |
| Example 5 | ○ | 102 | ○ | 107 | 389 |
| Example 6 | ○ | 101 | ○ | 105 | 378 |
| Example 7 | ○ | 106 | ○ | 109 | 368 |
| Example 8 | ○ | 101 | ○ | 105 | 359 |
| Example 9 | ○ | 102 | ○ | 106 | 361 |
| Example 10 | ○ | 102 | ○ | 104 | 366 |
| Example 11 | ○ | 105 | ○ | 107 | 352 |
| Example 12 | ○ | 102 | ○ | 105 | 370 |
| Example 13 | ○ | 100 | ○ | 101 | 372 |
| Example 14 | ○ | 104 | ○ | 106 | 366 |
| Example 15 | ○ | 106 | ○ | 108 | 368 |
| Example 16 | ○ | 107 | ○ | 108 | 369 |
| Example 17 | ○ | 107 | ○ | 110 | 358 |
| Example 18 | ○ | 102 | ○ | 103 | 375 |
| Example 19 | ○ | 101 | ○ | 102 | 379 |
| Comparative Example 1 | X | 112 | X | 133 | 255 |
| Comparative Example 2 | X | 110 | X | 129 | 262 |
| Comparative Example 3 | ○ | 101 | ○ | 102 | 397 |
| Comparative Example 4 | ○ | 102 | ○ | 106 | 385 |
| Comparative Example 5 | ○ | 103 | ○ | 108 | 388 |
| Comparative Example 6 | ○ | 102 | ○ | 106 | 388 |
| Comparative Example 7 | ○ | 103 | ○ | 106 | 387 |
| Comparative Example 8 | ○ | 102 | ○ | 107 | 389 |
| Comparative Example 9 | —*1 | 0*1 | X | 121 | 245 |
| Comparative Example 10 | X | 23*2 | X | 116 | 296 |
| Comparative Example 11 | ○ | 103 | ○ | 105 | 372 |
| Comparative Example 12 | ○ | 105 | ○ | 105 | 360 |
| Comparative Example 13 | ○ | 102 | ○ | 104 | 360 |
| Comparative Example 14 | ○ | 104 | ○ | 105 | 361 |
| Comparative Example 15 | X | 24*2 | X | 119 | 251 |
| Comparative Example 16 | X | 63*2 | X | 114 | 301 |
| Comparative Example 17 | ○ | 104 | ○ | 106 | 382 |
| Comparative Example 18 | ○ | 105 | ○ | 106 | 365 |
| Comparative Example 19 | ○ | 102 | ○ | 105 | 366 |
| Comparative Example 20 | ○ | 102 | ○ | 106 | 365 |
| Comparative Example 21 | X | 110 | X | 135 | 261 |
| Comparative Example 22 | X | 112 | X | 131 | 260 |
| Comparative Example 23 | —*1 | 0*1 | X | 120 | 246 |
| Comparative Example 24 | —*1 | 0*1 | X | 119 | 250 |
| Comparative Example 25 | X | 31*2 | X | 120 | 250 |
| Comparative Example 26 | X | 35*2 | X | 122 | 252 |

Indication of evaluation on crack
○: No cracks occurred
X: Cracks occurred
*1 Film had no resistance and was completely dissolved.
*2 Film had low resistance and considerably decreased.

In Comparative Examples 1, 9 and 15, the melamine resin among the requirements of the present invention was not present, and as compared with them, in the Examples of the present invention, excellent lithography characteristics and high heat resistance and chemical resistance were all attained at remarkably high levels, and the resin compositions can be sufficiently applicable to a process of production of semiconductor devices which require high accuracy and are exposed to high temperatures.

In Comparative Examples 2, 10 and 16, the amount of the melamine resin added was smaller than the suitable range in the present invention, and in Comparative Examples 3, 11 and 17, the amount of the melamine resin was too large. When the amount of the melamine resin was too small, heat resistance and chemical resistance were insufficient, and on the other hand, when it was too large, the heat resistance and chemical resistance were acceptable, but residues after development were considerably generated. Thus, in any way, the compositions of the Comparative Examples were inferior to those of the Examples of the present invention.

In Comparative Examples 4-5, the polyamide as the component A of the present invention was a polybenzoxazole precursor, and furthermore the introduction proportion of the group having a photopolymerizable unsaturated double bond was smaller or larger than the suitable range in the present invention.

Moreover, in Comparative Examples 6, 12 and 18, the amount of the monomer having a photopolymerizable unsaturated double bond which was the component B of the present invention was larger than the suitable range in the present invention.

Furthermore, in Comparative Examples 7-8, 13-14 and 19-20, the amount of the photopolymerization initiator which was the component C of the present invention was smaller or larger than the suitable range in the present invention. In both cases, sufficient lithography characteristics could not be ensured, and the compositions of these Comparative Examples were inferior to those of the Examples of the present invention.

In Comparative Examples 21-26, an epoxy resin crosslinking agent or triallyl isocyanurate which was a general crosslinking agent was used in place of the melamine resin of the present invention, and in these Comparative Examples the chemical resistance and high-temperature flux resistance could not utterly be ensured, and the compositions of these Comparative Examples were inferior to those of the Examples of the present invention.

INDUSTRIAL APPLICABILITY

As mentioned above, the negative type photosensitive resin compositions provided by the present invention have excellent lithography characteristics of alkali development negative type or solvent development negative type and simultaneously the polybenzoxazole or polyimide films obtained by heat curing the coating film of the photosensitive resin compositions have markedly high heat resistance and chemical resistance. Thus, the compositions can sufficiently satisfy the high demands in recent processes for the production of semiconductor devices.

What is claimed is:

1. A negative type photosensitive resin composition which comprises:
   (A) 100 parts of a polyamide having a structural unit represented by the following formula (1) and having a photopolymerizable unsaturated double bond,
   (B) 1-50 parts of a monomer having a photopolymerizable unsaturated double bond,
   (C) 1-20 parts of a photopolymerization initiator, and
   (D) 5-30 parts of a melamine resin,

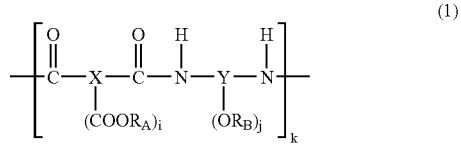

(where X is a 2-4 valent aromatic group and Y is a 2-4 valent aromatic group, i and j are integers of 0-2 and satisfy i+j=2, k is an integer of 2-150, $R_A$ is independently a monovalent organic group having a photopolymerizable unsaturated double bond and represented by the following formula (2) or a saturated aliphatic group of 1-4 carbon atoms, and $R_B$ is independently a hydrogen atom or a monovalent organic group having a photopolymerizable unsaturated double bond and represented by the following formula (3), with the proviso that when the total mol number of $R_B$ is assumed to be 100 mol %, not less than 10 mol % and not more than 50 mol % thereof is the monovalent organic group having a photopolymerizable unsaturated double bond and represented by the following formula (3),

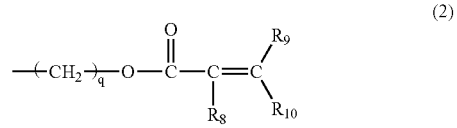

where $R_8$ is a hydrogen atom or an organic group of 1-3 carbon atoms, $R_9$ and $R_{10}$ are independently a hydrogen atom or an organic group of 1-3 carbon atoms, and q is an integer of 2-10,

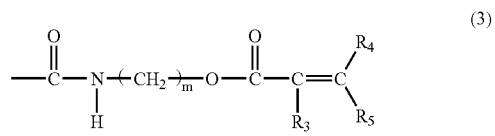

where $R_3$ is a hydrogen atom or an organic group of 1-3 carbon atoms, $R_4$ and $R_5$ are independently a hydrogen atom or an organic group of 1-3 carbon atoms, and m is an integer of 2-10).

2. A negative type photosensitive resin composition according to claim 1, wherein the polyamide (A) having a photopolymerizable unsaturated double bond is a polybenzoxazole precursor having a structural unit represented by the following formula (4):

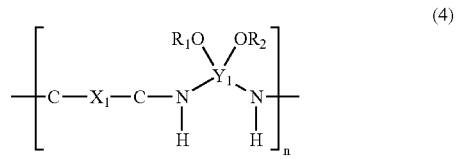

(where $X_1$ is a divalent aromatic group, $Y_1$ is a tetravalent aromatic group, n is an integer of 2-150, and $R_1$ and $R_2$ are independently a hydrogen atom or a monovalent organic group having a photopolymerizable unsaturated double bond and represented by the following formula (3), with the proviso that when the total mol of $R_1$ and $R_2$ is assumed to be 100 mol %, not less than 10 mol % and not more than 50 mol% of $R_1$ and $R_2$ are the monovalent organic groups having a photopolymerizable unsaturated double bond and represented by the following formula (3):

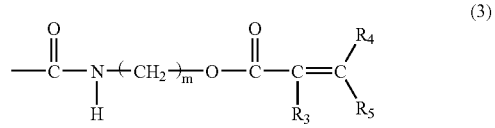

where $R_3$ is a hydrogen atom or an organic group of 1-3 carbon atoms, $R_4$ and $R_5$ are independently a hydrogen atom or an organic group of 1-3 carbon atoms, and m is an integer of 2-10).

3. A negative type photosensitive resin composition according to claim 1, wherein the polyamide (A) having a photopolymerizable unsaturated double bond is a polyimide precursor having a structural unit represented by the following formula (5):

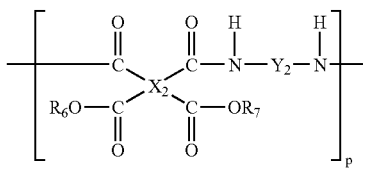

(where $X_2$ is a tetravalent aromatic group, and the —$COOR_6$ group and the —$COOR_7$ group, and the —CONH— group adjacent thereto are in the ortho position to each other, $Y_2$ is a divalent aromatic group, p is an integer of 2-150, and $R_6$ and $R_7$ are independently a monovalent organic group having a photopolymerizable unsaturated double bond and represented by the following formula (2) or a saturated aliphatic group of 1-4 carbon atoms:

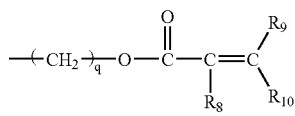

where $R_8$ is a hydrogen atom or an organic group of 1-3 carbon atoms, $R_9$ and $R_{10}$ are independently a hydrogen atom or an organic group of 1-3 carbon atoms, and q is an integer of 2-10).

4. A negative type photosensitive resin composition according to any one of claims 1-3, wherein the melamine resin (D) has a polymerization degree of not less than 1.0 and not more than 2.2.

5. A negative type photosensitive resin composition according to any one of claims 1-3, wherein the melamine resin (D) is a hexamethoxymethylated melamine.

6. A method for forming a heat resistant and chemical resistant relief pattern which comprises:

(1) coating the negative type photosensitive resin composition according to any one of claims 1-3 on a substrate,
(2) subjecting the coating to exposure by irradiating with active rays through a patterning mask,
(3) dissolving and removing the unexposed portions of the coating using a developer to form a relief pattern, and
(4) heating the coating at a temperature of not lower than 200° C. to cure the coating.

7. A method for producing a semiconductor device which includes forming a relief pattern by the relief pattern forming method according to claim 6.

8. A method for forming a heat resistant and chemical resistant relief pattern which comprises:

(1) coating the negative type photosensitive resin composition according to claim 4 on a substrate,
(2) subjecting the coating to exposure by irradiating with active rays through a patterning mask,
(3) dissolving and removing the unexposed portions of the coating using a developer to form a relief pattern, and
(4) heating the coating at a temperature of not lower than 200° C. to cure the coating.

9. A method for producing a semiconductor device which includes forming a relief pattern by the relief pattern forming method according to claim 8.

10. A method for forming a heat resistant and chemical resistant relief pattern which comprises:

(1) coating the negative type photosensitive resin composition according to claim 5 on a substrate,
(2) subjecting the coating to exposure by irradiating with active rays through a patterning mask,
(3) dissolving and removing the unexposed portions of the coating using a developer to form a relief pattern, and
(4) heating the coating at a temperature of not lower than 200° C. to cure the coating.

11. A method for producing a semiconductor device which includes forming a relief pattern by the relief pattern forming method according to claim 10.

* * * * *